(12) United States Patent
Park et al.

(10) Patent No.: US 12,446,277 B2
(45) Date of Patent: Oct. 14, 2025

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Beomjin Park, Hwaseong-si (KR); Myung Gil Kang, Suwon-si (KR); Daewon Kim, Hwaseong-si (KR); Dongwon Kim, Seongnam-si (KR); Jaehoon Shin, Suwon-si (KR); Keun Hwi Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 572 days.

(21) Appl. No.: 17/859,242

(22) Filed: Jul. 7, 2022

(65) Prior Publication Data

US 2023/0107537 A1    Apr. 6, 2023

(30) Foreign Application Priority Data

Sep. 27, 2021   (KR) .................. 10-2021-0127459

(51) Int. Cl.
   *H01L 29/06*   (2006.01)
   *H01L 29/66*   (2006.01)
   (Continued)

(52) U.S. Cl.
   CPC ........... *H10D 62/121* (2025.01); *H10D 30/43* (2025.01); *H10D 30/6713* (2025.01); *H10D 30/6757* (2025.01); *H10D 64/021* (2025.01)

(58) Field of Classification Search
   CPC .. H10D 62/121; H10D 30/43; H10D 30/6713; H10D 30/6757; H10D 64/021; H10D 30/797; H10D 64/017; H10D 30/014; H10D 30/6735; H10D 62/151; H10D 64/256; H10D 84/0151; H10D 84/0158; H10D 84/038; H10D 84/834; H10D 62/822; H10D 62/832; H10D 84/0135;
   (Continued)

(56) References Cited

U.S. PATENT DOCUMENTS 10,832,916 B1    11/2020    Xie et al.
10,879,073 B2    12/2020    Park et al.
(Continued)

FOREIGN PATENT DOCUMENTS

KR    1020180053803 A    5/2018
KR    10-2019-0056907 A   5/2019
KR    10-2022-0136527 A1  10/2022

*Primary Examiner* — Tong-Ho Kim
(74) *Attorney, Agent, or Firm* — Muir Patent Law, PLLC

(57) ABSTRACT

A semiconductor device including a substrate that includes first and second regions; a first active pattern on the first region and a second active pattern on the second region; a first gate electrode on the first active pattern and a second gate electrode on the second active pattern; and a first cutting pattern that penetrates the first gate electrode and a second cutting pattern that penetrates the second gate electrode, wherein a width of the first gate electrode as measured in one direction is less than a width of the second gate electrode, a maximum width of the first cutting pattern is greater than the width of the first gate electrode, and a minimum width of the second cutting pattern is less than the width of the second gate electrode.

20 Claims, 28 Drawing Sheets

(51) Int. Cl.
  *H01L 29/775* (2006.01)
  *H01L 29/786* (2006.01)
  *H10D 30/43* (2025.01)
  *H10D 30/67* (2025.01)
  *H10D 62/10* (2025.01)
  *H10D 64/01* (2025.01)

(58) Field of Classification Search
  CPC ............. H10D 84/0167; H10D 84/017; H10D 84/0172; H10D 84/0181; H10D 84/0188; H10D 84/85; B82Y 10/00
  USPC .......................................... 257/153
  See application file for complete search history.

(56) References Cited

U.S. PATENT DOCUMENTS

| | | |
|---|---|---|
| 10,923,401 B2 | 2/2021 | Greene et al. |
| 10,930,498 B2 | 2/2021 | Wang et al. |
| 2019/0148539 A1* | 5/2019 | Yang ................... H01L 21/0337 257/401 |
| 2019/0157444 A1 | 5/2019 | Yang et al. |
| 2020/0343387 A1* | 10/2020 | Liaw .................. H10D 30/6757 |
| 2020/0381514 A1 | 12/2020 | Song et al. |
| 2022/0320312 A1 | 10/2022 | Park et al. |

\* cited by examiner

SEMICONDUCTOR DEVICE AND METHOD OF FABRICATING THE SAME

CROSS-REFERENCE TO RELATED APPLICATION

This U.S. nonprovisional application claims priority under 35 U.S.C § 119 to Korean Patent Application No. 10-2021-0127459 filed on Sep. 27, 2021, in the Korean Intellectual Property Office, the disclosure of which is hereby incorporated by reference in its entirety.

BACKGROUND

1. Field

Embodiments relate to a semiconductor device and a method of fabricating the same.

2. Description of the Related Art

A semiconductor device may include an integrated circuit including metal oxide semiconductor field effect transistors (MOSFETs). As sizes and design rules of the semiconductor device are gradually decreased, sizes of the MOSFETs are also increasingly scaled down.

SUMMARY

The embodiments may be realized by providing a semiconductor device including a substrate that includes a first region and a second region; a first active pattern on the first region and a second active pattern on the second region; a first gate electrode on the first active pattern and a second gate electrode on the second active pattern; and a first cutting pattern that penetrates the first gate electrode and a second cutting pattern that penetrates the second gate electrode, wherein a width of the first gate electrode as measured in one direction is less than a width of the second gate electrode as measured in the one direction, a maximum width of the first cutting pattern as measured in the one direction is greater than the width of the first gate electrode as measured in the one direction, and a minimum width of the second cutting pattern as measured in the one direction is less than the width of the second gate electrode as measured in the one direction.

The embodiments may be realized by providing a semiconductor device including a substrate that includes a first active region and a second active region; a first active pattern on the first active region and a second active pattern on the second active region; a pair of first source/drain patterns on the first active pattern and a first channel pattern between the pair of first source/drain patterns, the first channel pattern including a plurality of first semiconductor patterns that are stacked on the first active pattern; a pair of second source/drain patterns on the second active pattern and a second channel pattern between the pair of second source/drain patterns, the second channel pattern including a plurality of second semiconductor patterns that are stacked on the second active pattern; a gate electrode on the first and second channel patterns; and a cutting pattern that penetrates the gate electrode, wherein the cutting pattern separates the gate electrode into a first gate electrode on the first channel pattern and a second gate electrode on the second channel pattern, the cutting pattern includes a first part adjacent to the first gate electrode; a second part adjacent to the second electrode; and a third part between the first part and the second part, the first part has a first width as measured in one direction, the second part has a second width as measured in the one direction, the third part has a third width as measured in the one direction, the third width is greater than the first width, and the third width is greater than the second width.

The embodiments may be realized by providing a semiconductor device including a substrate including a core/peripheral region; an active pattern on the core/peripheral region of the substrate; a pair of source/drain patterns on the active pattern and a channel pattern between the pair of source/drain patterns, the channel pattern including a plurality of semiconductor patterns that are spaced apart from each other and are sequentially stacked on the active pattern; a gate electrode on the plurality of semiconductor patterns; a gate dielectric layer between the gate electrode and the plurality of semiconductor patterns, the gate dielectric layer surrounding each of the plurality of semiconductor patterns; a cutting pattern that penetrates the gate electrode; a gate spacer on a sidewall of the gate electrode and a sidewall of the cutting pattern; an active contact electrically connected to at least one of the pair of source/drain patterns; a gate contact electrically connected to the gate electrode; a first metal layer on the active contact and the gate contact, the first metal layer including a plurality of first wiring lines that are electrically connected to the active contact and the gate contact; and a second metal layer on the first metal layer, wherein a minimum width of the cutting pattern as measured in one direction is less than a width of the gate electrode as measured in the one direction.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
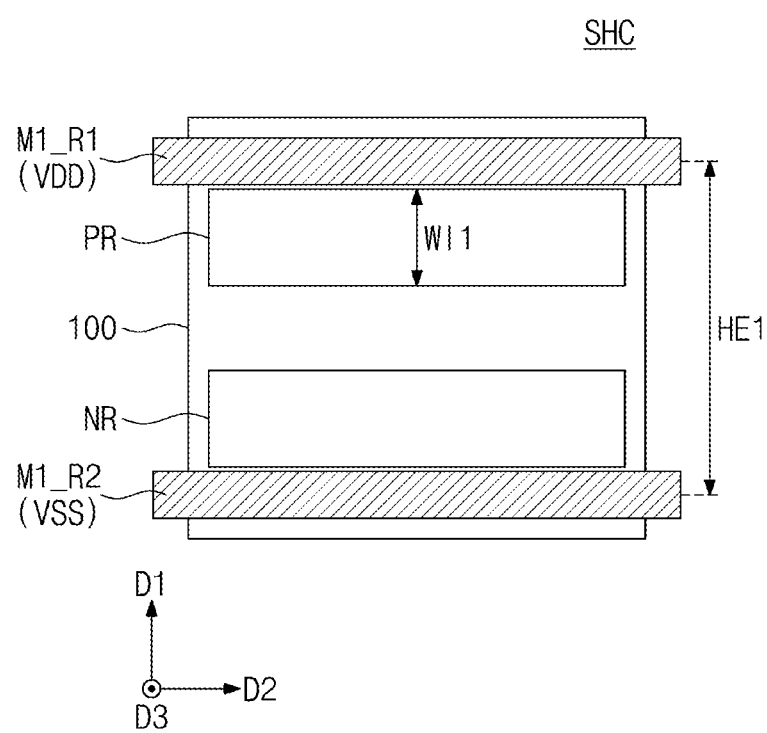
FIGS. 1 to 3 illustrate conceptual views of logic cells of a semiconductor device according to some embodiments.
Figure 2:
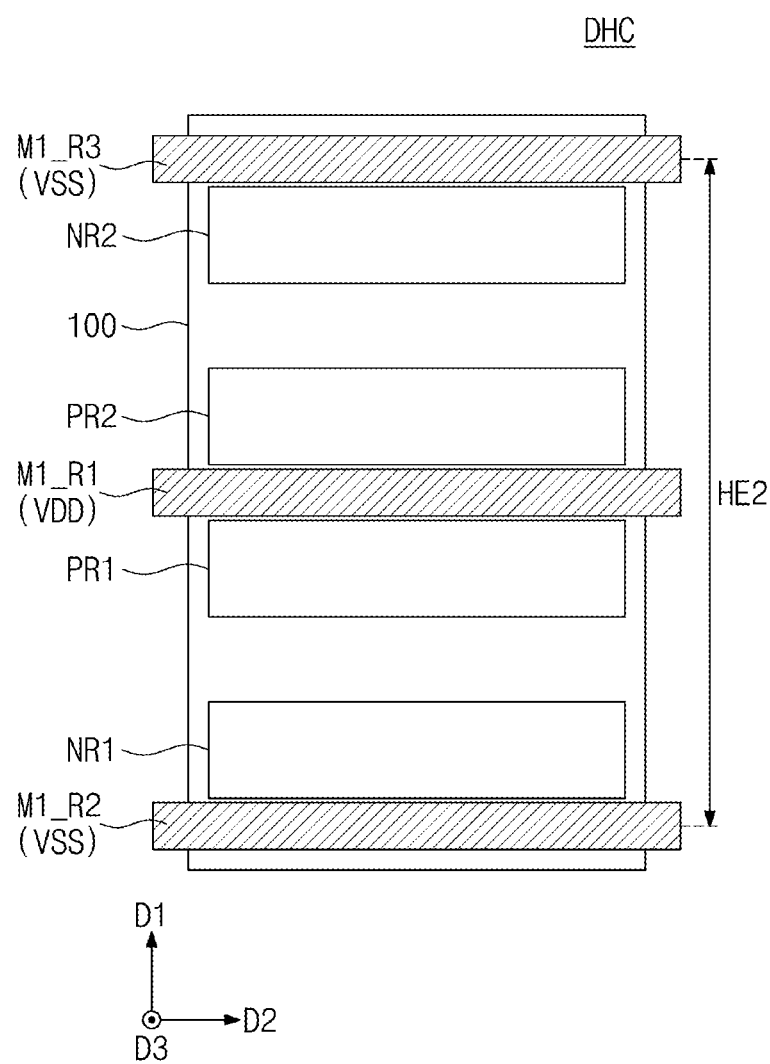
Figure 3:
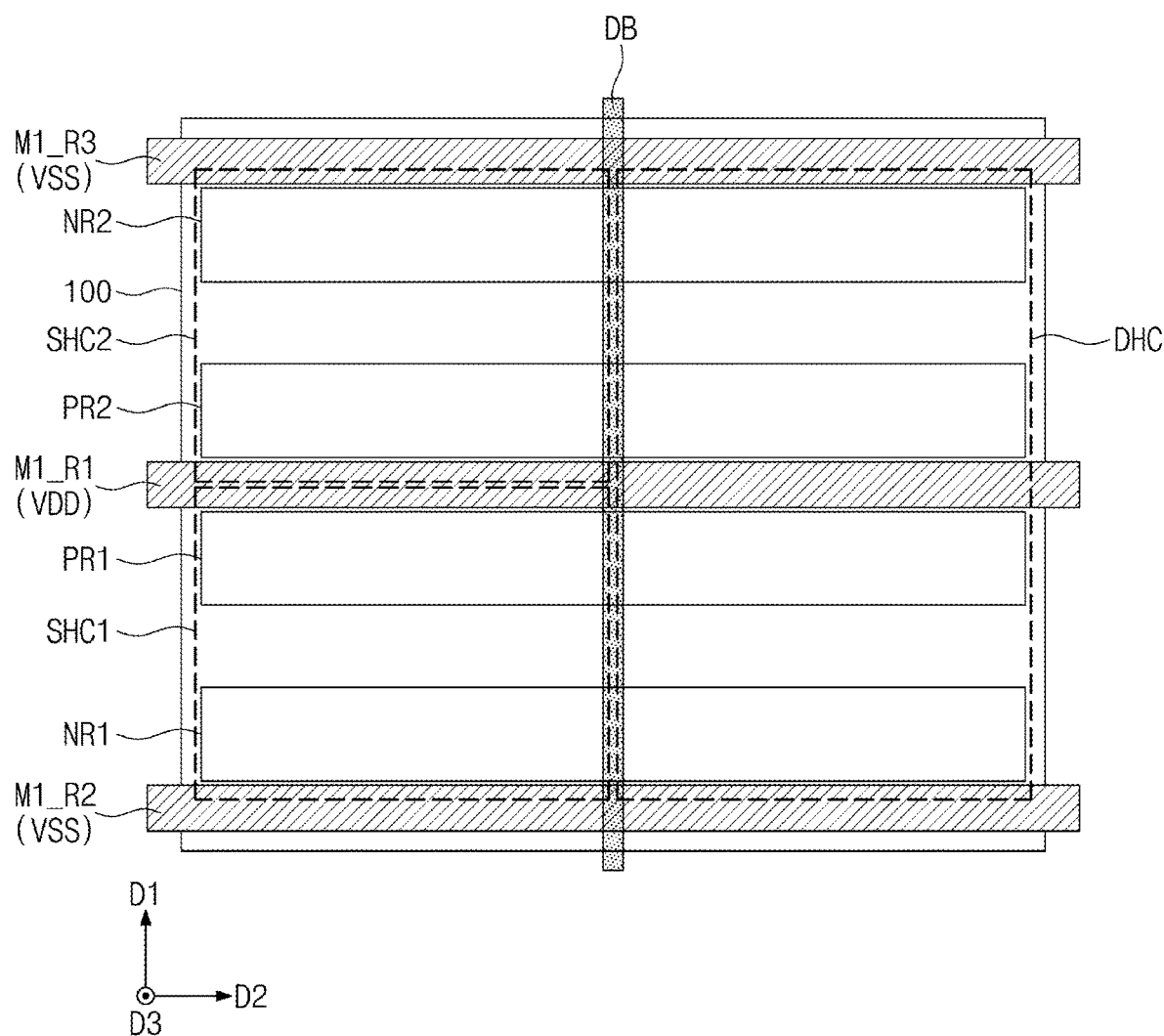

FIGS. 1 to 3 illustrate conceptual views of logic cells of a semiconductor device according to some embodiments.

Referring to FIG. 1, a single height cell SHC may be provided. In an implementation, a substrate 100 may be provided thereon with a first power line M1_R1 and a second power line M1_R2. The first power line M1_R1 may be a path for providing a drain voltage VDD, e.g., a power voltage. The second power line M1_R2 may be a path for providing a source voltage VSS, e.g., a ground voltage. As used herein, the terms "first," "second," and the like are merely for identification and differentiation, and are not intended to imply or require sequential inclusion (e.g., a third element and a fourth element may be described without implying or requiring the presence of a first element or second element).

The single height cell SHC may be defined between the first power line M1_R1 and the second power line M1_R2. The single height cell SHC may include one PMOSFET region PR and one NMOSFET region NR. In an implementation, the single height cell SHC may have a complementary metal oxide semiconductor (CMOS) structure between the first power line M1_R1 and the second power line M1_R2.

Each of the PMOSFET and NMOSFET regions PR and NR may have a first width WI1 in a first direction D1. A first height HE1 may be a length in the first direction D1 of the single height cell SHC. The first height HE1 may be substantially the same as a distance (e.g., pitch) between the first power line M1_R1 and the second power line M1_R2.

The single height cell SHC may constitute one logic cell. In this description, the logic cell may mean a logic device, such as AND, OR, XOR, XNOR, and inverter, that performs a specific function. In an implementation, the logic cell may include transistors for constituting a logic device and wiring lines that connect the transistors to each other.

Referring to FIG. 2, a double height cell DHC may be provided. In an implementation, a substrate 100 may be provided thereon with a first power line M1_R1, a second power line M1_R2, and a third power line M1_R3. The first power line M1_R1 may be between the second power line M1_R2 and the third power line M1_R3. The third power line M1_R3 may be a path to which a drain voltage VDD is provided.

The double height cell DHC may be defined between the second power line M1_R2 and the third power line M1_R3. The double height cell DHC may include a first PMOSFET region PR1, a second PMOSFET region PR2, a first NMOSFET region NR1, and a second NMOSFET region NR2.

The first NMOSFET region NR1 may be adjacent to the second power line M1_R2. The second NMOSFET region NR2 may be adjacent to the third power line M1_R3. The first and second PMOSFET regions PR1 and PR2 may be adjacent to the first power line M1_R1. When viewed in plan, the first power line M1_R1 may be between the first and second PMOSFET regions PR1 and PR2.

A second height HE2 may be a length in the first direction D1 of the double height cell DHC. The second height HE2 may be about twice the first height HE1 of FIG. 1. The first and second PMOSFET regions PR1 and PR2 of the double height cell DHC may be collectively coupled to operate as a single PMOSFET region.

In an implementation, the double height cell DHC may have a PMOS transistor whose channel size is greater than that of a PMOS transistor included in the single height cell SHC discussed above in FIG. 1. In an implementation, the channel size of the PMOS transistor included in the double height cell DHC may be about twice that of the PMOS transistor included in the single height cell SHC. In an implementation, the double height cell DHC may operate at higher speeds than those of the single height cell SHC. In an implementation, the double height cell DHC shown in FIG. 2 may be defined as a multi-height cell. In an implementation, the multi-height cell may include a triple height cell whose cell height is about three times that of the single height cell SHC.

Referring to FIG. 3, a substrate 100 may be provided thereon with a first single height cell SHC1, a second single height cell SHC2, and a double height cell DHC that are two-dimensionally disposed. The first single height cell SHC1 may be between a first power line M1_R1 and a second power line M1_R2. The second single height cell SHC2 may be between the first power line M1_R1 and a third power line M1_R3. The second single height cell SHC2 may be adjacent (in the first direction D1) to the first single height cell SHC1.

The double height cell DHC may be between the second power line M1_R2 and the third power line M1_R3. The double height cell DHC may be adjacent (in a second direction D2) to the first and second single height cells SHC1 and SHC2.

A separation structure DB may be between the first single height cell SHC1 and the double height cell DHC and between the second single height cell SHC2 and the double height cell DHC. The separation structure DB may electrically separate an active region of the double height cell DHC from an active region of each of the first and second single height cells SHC1 and SHC2.

Figure 4:
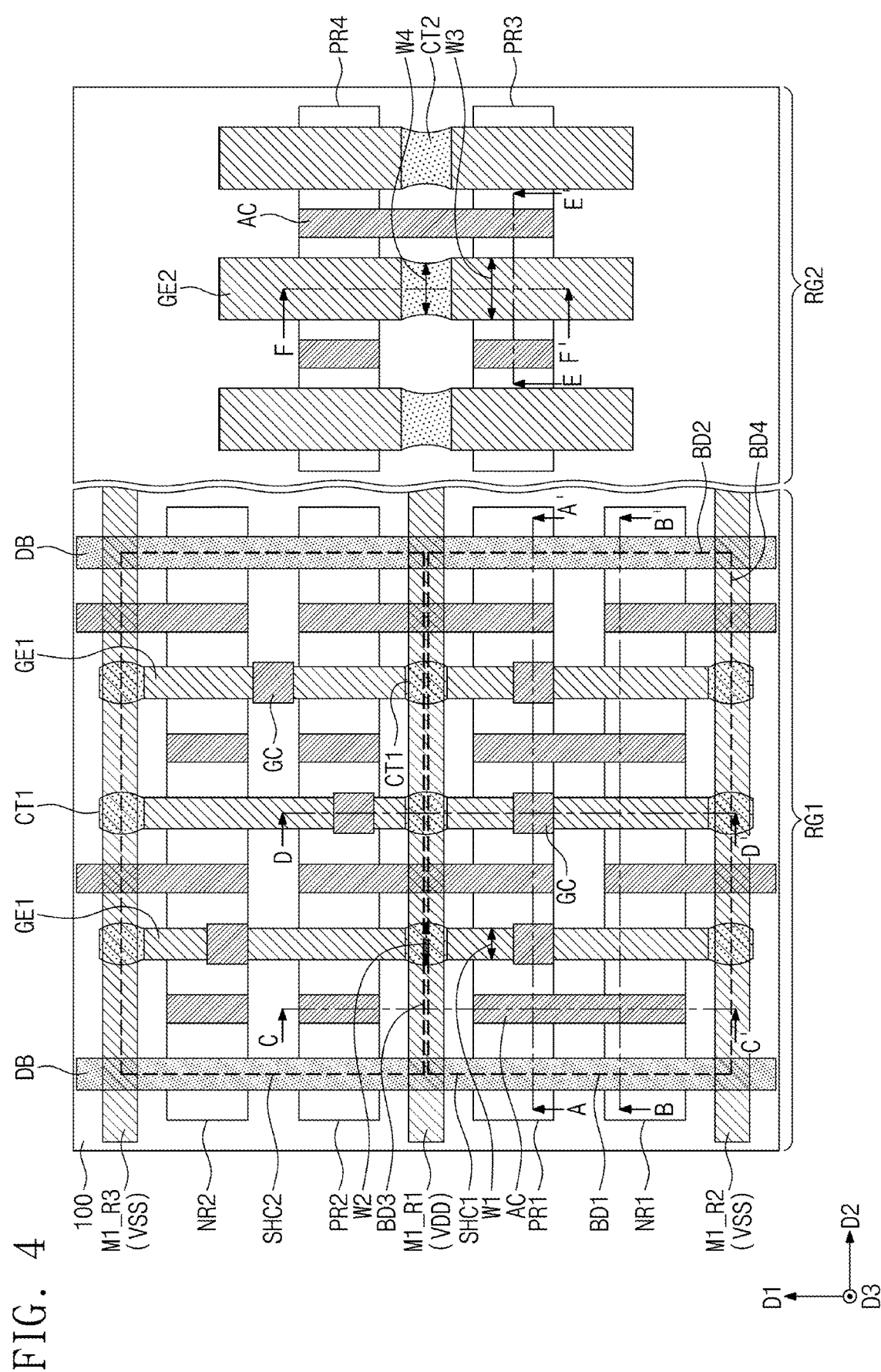
FIG. 4 illustrates a plan view of a semiconductor device according to some embodiments.

FIG. 4 illustrates a plan view of a semiconductor device according to some embodiments. FIGS. 5A, 5B, 5C, 5D, 5E, and 5F illustrate cross-sectional views respectively taken along lines A-A', B-B', C-C', D-D', E-E', and F-F' of FIG. 4. FIG. 6A illustrates a plan view taken along line M-M' of FIG. 5D. FIG. 6B illustrates a plan view taken along line N-N' of FIG. 5F.

Referring to FIGS. 4 and 5A to 5F, a substrate 100 may include a first region RG1 and a second region RG2. The substrate 100 may be a compound semiconductor substrate or a semiconductor substrate including silicon, germanium, or silicon-germanium. In an implementation, the substrate 100 may be a silicon substrate. As used herein, the term "or" is not an exclusive term, e.g., "A or B" would include A, B, or A and B.

The first region RG1 may be a logic cell region. First and second single height cells SHC1 and SHC2 may be on the first region RG1. Each of the first and second single height cells SHC1 and SHC2 may include logic transistors included in a logic circuit. The first and second single height cells SHC1 and SHC2 according to the present embodiment may be detailed examples of the first and second single height cells SHC1 and SHC2 of FIG. 3.

The second region RG2 may be an area accommodating transistors that constitute a process core or input/out terminals. In an implementation, the second region RG2 may be a core/peripheral area included in a logic die. The second region RG2 may include a long gate transistor (or, long channel transistor) whose gate length (or channel length) is relatively large. A transistor on the second region RG2 may operate at higher power levels than those of a transistor on the first region RG1. In an implementation, a transistor on the first region RG1 may be a single gate (SG) device, and a transistor on the second region RG2 may be an extra gate (EG) device. A transistor on the first region RG1 will be first discussed below in detail with reference to FIGS. 4 and 5A to 5D.

The first region RG1 of the substrate 100 may include a first PMOSFET region PR1, a second PMOSFET region PR2, a first NMOSFET region NR1, and a second NMOSFET region NR2. Each of the first and second PMOSFET regions PR1 and PR2 may be an active region, and each of the first and second NMOSFET regions NR1 and NR2 may also be an active region. Each of the active regions PR1, PR2, NR1, and NR2 may extend (e.g., lengthwise) in the second direction D2.

A first active pattern AP1 and a second active pattern AP2 may be defined by a trench TR on or at an upper portion of the substrate 100. The first active pattern AP1 may be on each of the first and second PMOSFET regions PR1 and PR2. The second active pattern AP2 may be on each of the first and second NMOSFET regions NR1 and NR2. The first and second active patterns AP1 and AP2 may extend in the second direction D2. The first and second active patterns AP1 and AP2 may be vertically protruding portions of the substrate 100.

The trench TR may be filled with a device isolation layer ST. The device isolation layer ST may include a silicon oxide layer. The device isolation layer ST may not cover any of first and second channel patterns CH1 and CH2 which will be discussed below.

A liner layer OLI may be between the device isolation layer ST and the first and second active patterns AP1 and AP2. The liner layer OLI may directly cover a sidewall of each of the first and second active patterns AP1 and AP2. In an implementation, the liner layer OLI may directly cover a sidewall of the trench TR. The liner layer OLI may directly cover a bottom surface of the trench TR. In an implementation, the liner layer OLI may include a silicon oxide layer, a silicon nitride layer, or a combination thereof. In an implementation, the liner layer OLI may include the same material as that of the device isolation layer ST, and in this case, no boundary may appear between the liner layer OLI and the device isolation layer ST.

A first channel pattern CH1 may be on the first active pattern AP1. A second channel pattern CH2 may be on the second active pattern AP2. Each of the first and second channel patterns CH1 and CH2 may include a first semiconductor pattern SP1, a second semiconductor pattern SP2, and a third semiconductor pattern SP3 that are sequentially stacked. The first, second, and third semiconductor patterns SP1, SP2, and SP3 may be spaced apart from each other in a vertical, third direction D3.

Each of the first, second, and third semiconductor patterns SP1, SP2, and SP3 may include, e.g., silicon (Si), germanium (Ge), or silicon-germanium (SiGe). In an implementation, each of the first, second, and third semiconductor patterns SP1, SP2, and SP3 may include crystalline silicon.

A plurality of first source/drain patterns SD1 may be on the first active pattern AP1. A plurality of first recesses RS1 may be on or in an upper portion of the first active pattern AP1. First source/drain patterns SD1 may be in corresponding first recesses RS1. The first source/drain patterns SD1 may be impurity regions having a first conductivity type (e.g., p-type). The first channel pattern CH1 may be between a pair of first source/drain patterns SD1. In an implementation, the pair of first source/drain patterns SD1 may be connected to each other through the stacked first, second, and third semiconductor patterns SP1, SP2, and SP3.

A plurality of second source/drain patterns SD2 may be on the second active pattern AP2. A plurality of second recesses RS2 may be on or in an upper portion of the second active pattern AP2. Second source/drain patterns SD2 may be in corresponding second recesses RS2. The second source/drain patterns SD2 may be impurity regions having a second conductivity type (e.g., n-type). The second channel pattern CH2 may be between a pair of second source/drain patterns SD2. In an implementation, the pair of second source/drain patterns SD2 may be connected to each other through the stacked first, second, and third semiconductor patterns SP1, SP2, and SP3.

The first and second source/drain patterns SD1 and SD2 may be epitaxial patterns formed by a selective epitaxial growth process. In an implementation, each of the first and second source/drain patterns SD1 and SD2 may have a top surface at a level substantially the same as that of a top surface of the third semiconductor pattern SP3. In an implementation, each of the first and second source/drain patterns SD1 and SD2 may have a top surface at a higher level than that of a top surface of the third semiconductor pattern SP3.

The first source/drain patterns SD1 may include a semiconductor element (e.g., SiGe) whose lattice constant is greater than that of a semiconductor element of the substrate 100. In an implementation, a pair of first source/drain patterns SD1 may provide the first channel pattern CH1 with compressive stress. The second source/drain patterns SD2 may include the same semiconductor element (e.g., Si) as that of the substrate 100.

Each of the first source/drain patterns SD1 may include a first semiconductor layer SEL1 and a second semiconductor layer SEL2 on the first semiconductor layer SEL1. With reference back to FIG. 5A, the following will describe a cross-sectional shape in the second direction D2 of the first source/drain pattern SD1.

The first semiconductor layer SEL1 may cover an inner wall of the first recess RS1. The first semiconductor layer SEL1 may have a thickness that decreases in a direction toward an upper portion thereof from a lower portion thereof. In an implementation, a thickness in the third direction D3 of the first semiconductor layer SEL1 on a bottom surface of the first recess RS1 may be greater than a thickness in the second direction D2 of the first semiconductor layer SEL1 on an upper portion of the first recess RS1. The first semiconductor layer SEL1 may be shaped like a U along a profile of the first recess RS1.

The second semiconductor layer SEL2 may fill an unoccupied or remaining portion of the first recess RS1 that includes the first semiconductor layer SEL1 therein. The second semiconductor layer SEL2 may have a volume greater than that of the first semiconductor layer SEL1. In an implementation, a volume ratio of the second semiconductor layer SEL2 to the first source/drain pattern SD1 may be greater than a volume ratio of the first semiconductor layer SEL1 to the first source/drain pattern SD1.

Each of the first and second semiconductor layers SEL1 and SEL2 may include silicon-germanium (SiGe). In an implementation, the first semiconductor pattern SP1 may contain germanium (Ge) whose concentration is relatively low. In an implementation, the first semiconductor layer SEL1 may include only silicon (Si) and may not include germanium (Ge). The first semiconductor layer SEL1 may contain germanium (Ge) whose concentration ranges from about 0 at % to about 10 at %.

The second semiconductor layer SEL2 may contain germanium (Ge) whose concentration is relatively high. In an implementation, the second semiconductor layer SEL2 may contain germanium (Ge) whose concentration ranges from about 30 at % to about 70 at %. The concentration of germanium (Ge) in the second semiconductor layer SEL2 may increase in the third direction D3. In an implementation, the second semiconductor layer SEL2 adjacent to the first semiconductor layer SEL1 may have a germanium concentration of about 40 at %, and an upper portion of the second semiconductor layer SEL2 may have a germanium concentration of about 60 at %.

The first and second semiconductor layers SEL1 and SEL2 may include impurities (e.g., boron) that cause the first source/drain pattern SD1 to have a p-type conductivity type. The second semiconductor layer SEL2 may have an impurity concentration (e.g., atomic percent) greater than that of the first semiconductor layer SEL1.

The first semiconductor layer SEL1 may help prevent stacking faults between the substrate 100 and the second semiconductor layer SEL2 and between the second semiconductor layer SEL2 and the first, second, and third semiconductor patterns SP1, SP2, and SP3. The occurrence of stacking faults may increase a channel resistance. The stacking faults could easily occur at bottom of the first recess RS1. Accordingly, the first semiconductor layer SEL1 adjacent to the bottom of the first recess RS1 may have a relatively large thickness to help prevent the stacking faults.

The first semiconductor layer SEL1 may protect the second semiconductor layer SEL2 while sacrificial layers SAL are replaced with first, second, and third parts PO1, PO2, and PO3 of a first gate electrode GE1 which will be discussed below. In an implementation, the first semiconductor layer SEL1 may help prevent the second semiconductor layer SEL2 from being etched with an etching material that etches the sacrificial layers SAL.

First gate electrodes GE1 may extend in the first direction D1, while running across the first and second channel patterns CH1 and CH2. The first gate electrodes GE1 may be arranged along the second direction D2 at a first pitch. Each of the first gate electrodes GE1 may vertically overlap the first and second channel patterns CH1 and CH2.

The first gate electrode GE1 may include a first part PO1 between the first active pattern AP1 (or the second active pattern AP2) and the first semiconductor pattern SP1, a second part PO2 between the first semiconductor pattern SP1 and the second semiconductor pattern SP2, a third part PO3 between the second semiconductor pattern SP2 and the third semiconductor pattern SP3, and a fourth part PO4 on the third semiconductor pattern SP3.

Referring back to FIG. 5A, on the first PMOSFET region PR1, the first gate electrode GE1 may have different widths at the first, second, and third parts PO1, PO2, and PO3 thereof. In an implementation, a maximum width in the second direction D2 of the third part PO3 may be greater than a maximum width in the second direction D2 of the second part PO2. A maximum width in the second direction D2 of the first part PO1 may be greater than the maximum in the second direction D2 of the third part PO3.

Referring back to FIG. 5D, the first gate electrode GE1 may be on a top surface TS, a bottom surface BS, and opposite sidewalls SW1 and SW1 of each of the first, second, and third semiconductor patterns SP1, SP2, and SP3. In this sense, a transistor according to the present embodiment may be a three-dimensional field effect transistor (e.g., MBCFET or GAAFET) in which the gate electrode GE three-dimensionally surrounds the first and second channel patterns CH1 and CH2.

In an implementation, the first single height cell SHC1 may have a first boundary BD1 and a second boundary BD2 that are opposite to each other in the second direction D2. The first and second boundaries BD1 and BD2 may extend in the first direction D1. The first single height cell SHC1 may have a third boundary BD3 and a fourth boundary BD4 that are opposite to each other in the first direction D1. The third and fourth boundaries BD3 and BD4 may extend in the second direction D2.

First cutting patterns CT1 may be on or at boundaries (in the second direction D2) of each of the first and second single height cells SHC1 and SHC2. In an implementation, the first cutting patterns CT1 may be on the third and fourth boundaries BD3 and BD4 of the first single height cell SHC1. The first cutting patterns CT1 may be arranged at the first pitch along the third boundary BD3. The first cutting patterns CT1 may be arranged at the first pitch along the fourth boundary BD4. When viewed in plan, the first cutting patterns CT1 on the third and fourth boundaries BD3 and BD4 may overlap corresponding first gate electrodes GE1. The first cutting patterns CT1 may include a dielectric material, e.g., a silicon oxide layer, a silicon nitride layer, or a combination thereof.

The first cutting pattern CT1 may separate the first gate electrode GE1 on the first single height cell SHC1 from the first gate electrode GE1 on the second single height cell SHC2. The first cutting pattern CT1 may be between the first gate electrode GE1 on the first single height cell SHC1 and the first gate electrode GE1 on the second single height cell SHC2, which first gate electrodes GE1 are aligned with each other in the first direction D1. In an implementation, the first cutting patterns CT1 may separate the first gate electrode GE1 that extends in the first direction D1 into a plurality of first gate electrodes GE1.

The first cutting pattern CT1 may have a top surface higher than (e.g., farther from the substrate 100 in the third direction D3 than) that of the first gate electrode GE1. The first gate electrode GE1 on the first single height cell SHC1 may have a first end EN1 that faces the first cutting pattern CT1. In an implementation, the first end EN1 of the first gate electrode GE1 may include a climbing portion CLB. The climbing portion CLB may extend obliquely (e.g., at an inclined angle) from a top surface of the first gate electrode GE1 toward the top surface of the first cutting pattern CT1.

Referring back to FIGS. 4 and 5A to 5D, a pair of gate spacers GS may be on opposite sidewalls of the fourth part PO4 of the first gate electrode GE1. The gate spacers GS may extend in the first direction D1 along the first gate electrode GE1. The gate spacers GS may have top surfaces higher than that of the first gate electrode GE1. The top surfaces of the gate spacers GS may be coplanar with that of a first interlayer dielectric layer 110 which will be discussed below. The gate spacers GS may include, e.g., SiCN, SiCON, or SiN. In an implementation, the gate spacers GS may each include a multiple layer formed of at least two selected from SiCN, SiCON, and SiN. In an implementation, as shown in FIG. 6A, the gate spacer GS may include a first spacer GS1 and a second spacer GS2.

A gate capping pattern GP may be on the first gate electrode GE1. The gate capping pattern GP may extend in the first direction D1 along the first gate electrode GE1. The gate capping pattern GP may include a material having an etch selectivity with respect to first and second interlayer dielectric layers 110 and 120 which will be discussed below. In an implementation, the gate capping pattern GP may include, e.g., SiON, SiCN, SiCON, or SiN.

A gate dielectric layer GI may be between the first gate electrode GE1 and the first channel pattern CH1 and between the first gate electrode GE1 and the second channel pattern CH2. The gate dielectric layer GI may cover the top surface TS, the bottom surface BS, and the opposite sidewalls SW1 and SW2 of each of the first, second, and third semiconductor patterns SP1, SP2, and SP3. The gate dielectric layer GI may cover a top surface of the device isolation layer ST below the first gate electrode GE1. The gate dielectric layer GI may cover a sidewall of the first cutting pattern CT1 (see FIG. 5D).

In an implementation, the gate dielectric layer GI may include, e.g., a silicon oxide layer, a silicon oxynitride layer, or a high-k dielectric layer. The high-k dielectric layer may include a high-k dielectric material whose dielectric constant is greater than that of a silicon oxide layer. In an implementation, the high-k dielectric material may include, e.g., hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In an implementation, the semiconductor device may include a negative capacitance field effect transistor that uses a negative capacitor. In an implementation, the gate dielectric layer GI may include a ferroelectric material layer that exhibits ferroelectric properties and a paraelectric material layer that exhibits paraelectric properties.

The ferroelectric material layer may have a negative capacitance, and the paraelectric material layer may have a positive capacitance. In an implementation, when two or more capacitors are connected in series, and when each capacitor has a positive capacitance, an overall capacitance may be reduced to be less than the capacitance of each capacitor. In contrast, when at least one of two or more capacitors connected in series has a negative capacitance, an overall capacitance may have a positive value that is increased to be greater than an absolute value of the capacitance of each capacitor.

When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a sub-threshold swing of less than about 60 mV/decade at room temperature.

The ferroelectric material layer may have ferroelectric properties. The ferroelectric material layer may include, e.g., hafnium oxide, hafnium zirconium oxide, barium strontium titanium oxide, or lead zirconium titanium oxide. In an implementation, the hafnium zirconium oxide may be a material in which hafnium oxide is doped with zirconium (Zr). In an implementation, the hafnium zirconium oxide may be a compound of hafnium (Hf), zirconium (Zr), and oxygen (O).

The ferroelectric material layer may further include impurities doped therein. In an implementation, the impurities may include, e.g., aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The type of impurities included in the ferroelectric material layer may be changed depending on what ferroelectric material is included in the ferroelectric material layer.

When the ferroelectric material layer includes hafnium oxide, the ferroelectric material layer may include an impurity, e.g., gadolinium (Gd), silicon (Si), zirconium (Zr), aluminum (Al), or yttrium (Y).

When the impurities include aluminum (Al), the ferroelectric material layer may include about 3 to 8 atomic percent aluminum. In this description, the ratio of impurities may be a ratio of aluminum to the sum of hafnium and aluminum.

When the impurities include silicon (Si), the ferroelectric material layer may include about 2 to about 10 atomic percent silicon. When the impurities include yttrium (Y), the ferroelectric material layer may include about 2 to about 10 atomic percent yttrium. When the impurities include gadolinium (Gd), the ferroelectric material layer may include about 1 to about 7 atomic percent gadolinium. When the impurities include zirconium (Zr), the ferroelectric material layer may include about 50 to about 80 atomic percent zirconium.

The paraelectric material layer may have paraelectric properties. The paraelectric material layer may include, for example, at least one selected from silicon oxide and high-k metal oxide. In an implementation, the metal oxide included in the paraelectric material layer may include, e.g., hafnium oxide, zirconium oxide, or aluminum oxide.

The ferroelectric and paraelectric material layers may include the same material. The ferroelectric material layer may have ferroelectric properties, but the paraelectric material layer may not have ferroelectric properties. In an implementation, when the ferroelectric material layer and the paraelectric material layer include hafnium oxide, the hafnium oxide included in the ferroelectric material layer may have a crystal structure different from that of the hafnium oxide included in the paraelectric material layer.

The ferroelectric material layer may have a thickness having ferroelectric properties. In an implementation, the thickness of the ferroelectric material layer may range, e.g., from about 0.5 nm to about 10 nm. Because ferroelectric materials have their own critical thickness that exhibits ferroelectric properties, the thickness of the ferroelectric material layer may depend on ferroelectric material.

In an implementation, the gate dielectric layer GI may include a single ferroelectric material layer. For another example, the gate dielectric layer GI may include a plurality of ferroelectric material layers that are spaced apart from each other. The gate dielectric layer GI may have a stack structure in which a plurality of ferroelectric material layers are alternately stacked with a plurality of paraelectric material layers.

The first gate electrode GE1 may include a first metal pattern and a second metal pattern on the first metal pattern. The first metal pattern may be on the gate dielectric layer GI and may be adjacent to the first, second, and third semiconductor patterns SP1, SP2, and SP3. The first metal pattern may include a work-function metal that controls a threshold voltage of a transistor. A thickness and composition of the first metal pattern may be adjusted to achieve a desired threshold voltage of a transistor. In an implementation, the first, second, and third parts PO1, PO2, and PO3 of the first gate electrode GE1 may be formed of the first metal pattern or work-function metal.

The first metal pattern may include a metal nitride layer. In an implementation, the first metal pattern may include nitrogen (N) and a metal, e.g., titanium (Ti), tantalum (Ta), aluminum (Al), tungsten (W), or molybdenum (Mo). In an implementation, the first metal pattern may further include carbon (C). The first metal pattern may include a plurality of stacked work-function metal layers.

The second metal pattern may include metal whose resistance is less than that of the first metal pattern. In an implementation, the second metal pattern may include, e.g., tungsten (W), aluminum (Al), titanium (Ti), or tantalum (Ta). In an implementation, the fourth part PO4 of the first gate electrode GE1 may include a first metal pattern and a second metal pattern on the first metal pattern.

Referring back to FIG. 5B, inner spacers IP may be on the first and second NMOSFET regions NR1 and NR2. The inner spacers IP may be correspondingly between the second source/drain pattern SD2 and the first, second, and third parts PO1, PO2, and PO3 of the first gate electrode GE1. The inner spacers IP may be in direct contact with the second source/drain pattern SD2. The inner spacers IP may separate the second source/drain pattern SD2 from the first, second, and third parts PO1, PO2, and PO3 of the first gate electrode GE1.

A first interlayer dielectric layer 110 may be on the substrate 100. The first interlayer dielectric layer 110 may cover the gate spacers GS and the first and second source/drain patterns SD1 and SD2. The first interlayer dielectric layer 110 may have a top surface substantially coplanar with that of the gate capping pattern GP and that of the gate spacer GS. The first interlayer dielectric layer 110 may be provided thereon with a second interlayer dielectric layer 120 that covers the gate capping pattern GP. A third interlayer dielectric layer 130 may be on the second interlayer dielectric layer 120. A fourth interlayer dielectric layer 140 may be on the third interlayer dielectric layer 130. In an implementation, the first to fourth interlayer dielectric layers 110 to 140 may include a silicon oxide layer.

Each of the first and second single height cells SHC1 and SHC2 may be provided on its opposite sides with a pair of separation structures DB that are opposite to each other in the second direction D2. In an implementation, the pair of separation structures DB may be correspondingly on first and second boundaries BD1 and BD2 of the first single height cell SHC1. The separation structure DB may extend in the first direction D1 parallel to the first gate electrodes GE1. The separation structure DB and its adjacent first gate electrode GE1 may have therebetween a pitch the same as the first pitch.

The separation structure DB may penetrate the first and second interlayer dielectric layers 110 and 120 to extend into the first and second active patterns AP1 and AP2. The separation structure DB may penetrate the upper portion of each of the first and second active patterns AP1 and AP2. The separation structure DB may electrically separate an active region of each of the first and second single height cells SHC1 and SHC2 from an active region of another cell.

Active contacts AC may penetrate the first and second interlayer dielectric layers 110 and 120 and to correspondingly electrically connect with the first and second source/drain patterns SD1 and SD2. A pair of active contacts AC may be on opposite sides of the first gate electrode GE1. When viewed in plan, the active contact AC may have a bar shape that extends in the first direction D1.

The active contact AC may be a self-aligned contact. In an implementation, the gate capping pattern GP and the gate spacer GS may be used to form the active contact AC in a self-alignment manner. The active contact AC may cover, e.g., at least a portion of a sidewall of the gate spacer GS. In an implementation, the active contact AC may cover a portion of the top surface of the gate capping pattern GP.

Silicide patterns SC may be correspondingly between the active contact AC and the first source/drain pattern SD1 and between the active contact AC and the second source/drain pattern SD2. The active contact AC may be electrically connected through the silicide pattern SC to one of the first and second source/drain patterns SD1 and SD2. The silicide pattern SC may include a metal silicide, e.g., titanium silicide, tantalum silicide, tungsten silicide, nickel silicide, or cobalt silicide.

Referring back to FIG. 5C, at least one active contact AC on the first single height cell SHC1 may electrically connect the first source/drain pattern SD1 of the first PMOSFET region PR1 to the second source/drain pattern SD2 of the first NMOSFET region NR1. The active contact AC may extend in the first direction D1 from the second source/drain pattern SD2 of the first NMOSFET region NR1 to the first source/drain pattern SD1 of the first PMOSFET region PR1. The active contact AC may include a first body BP1 on the first source/drain pattern SD1 and a second body BP2 on the second source/drain pattern SD2. The first body BP1 may be connected through the silicide pattern SC to a top surface of the first source/drain pattern SD1, and the second body BP2 may be connected through the silicide pattern SC to a top surface of the second source/drain pattern SD2. The active contact AC may further include a protrusion PRP between the first body BP1 and the second body BP2. The protrusion PRP may be on the device isolation layer ST between the first PMOSFET region PR1 and the first NMOSFET region NR1.

The protrusion PRP may extend from the first body BP1 toward the device isolation layer ST (e.g., downwardly), while running along an inclined sidewall of the first source/drain pattern SD1. The protrusion PRP may extend from the second body BP2 toward the device isolation layer ST, while running along an inclined sidewall of the second source/drain pattern SD2. The protrusion PRP may have a bottom surface lower than that of each of the first and second bodies BP1 and BP2. The bottom surface of the protrusion PRP may be higher than the device isolation layer ST. In an implementation, the protrusion PRP may be spaced apart from the device isolation layer ST across the first interlayer dielectric layer 110.

In an implementation, the active contact AC may not only be connected through the first body BP1 to the top surface of the first source/drain pattern SD1, but may also be connected through the protrusion PRP to the inclined sidewall of the first source/drain pattern SD1. In an implementation, the protrusion PRP may increase a contact area between the active contact AC and the first source/drain pattern SD1. In an implementation, there may be a reduction in resistance between the active contact AC and the first source/drain pattern SD1. In an implementation, the protrusion PRP may induce a reduction in resistance between the active contact AC and the second source/drain pattern SD2. In an implementation, it may be possible to increase an operating speed of a semiconductor device according to some embodiments.

Gate contacts GC may penetrate the second interlayer dielectric layer 120 and the gate capping patterns GP and to electrically connect with corresponding first gate electrodes GE1. When viewed in plan, the gate contacts GC on the first single height cell SHC1 may overlap the first PMOSFET region PR1. In an implementation, the gate contacts GC on the first single height cell SHC1 may be on the first active pattern AP1 (see FIG. 5A).

On the first gate electrode GE1, the gate contact GC may be freely disposed without limitation of position. In an implementation, the gate contacts GC on the second single height cell SHC2 may be on the second PMOSFET region PR2, the second NMOSFET region NR2, and the device isolation layer ST that fills the trench TR (see FIG. 4).

Figure 5A:
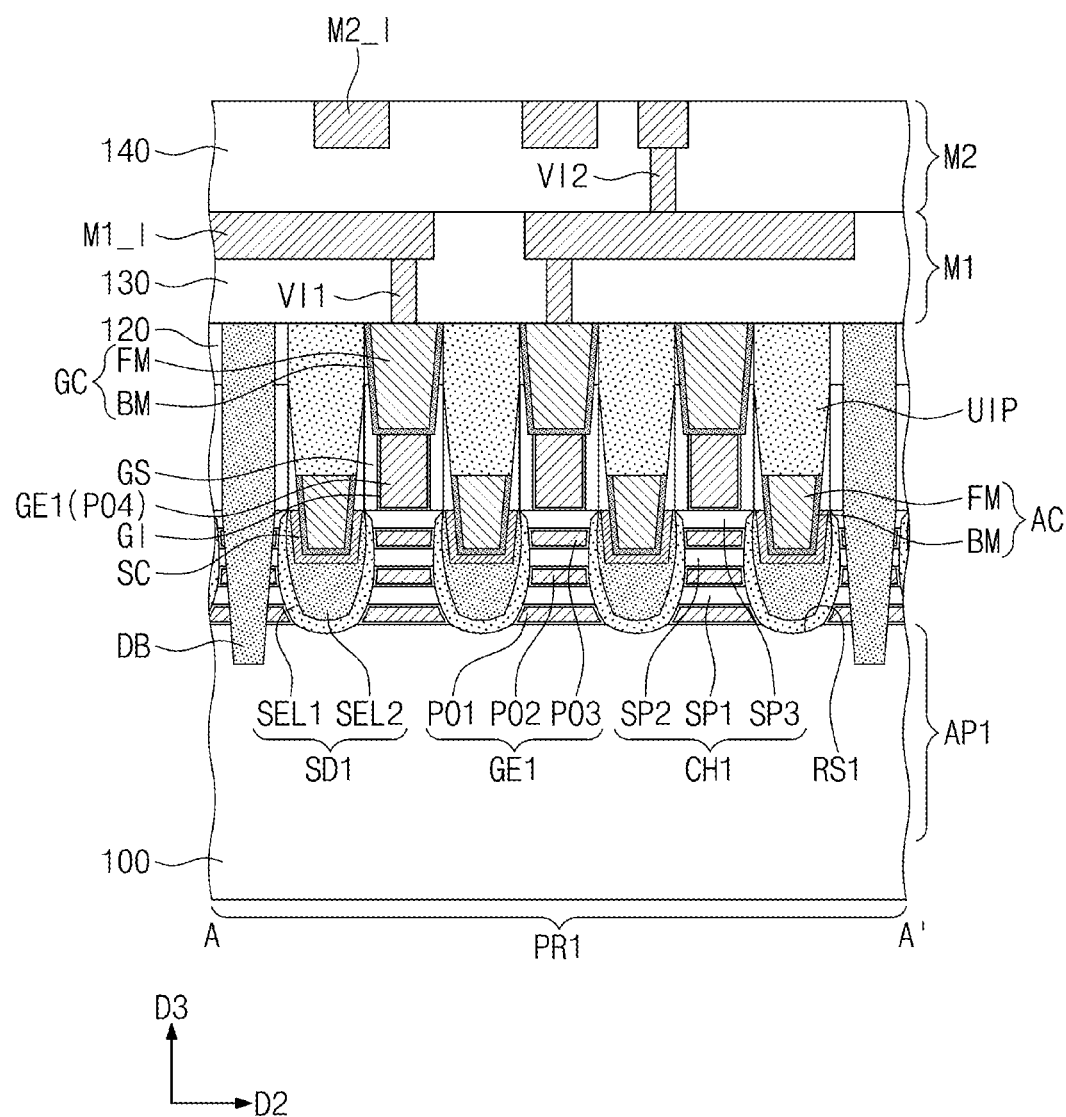
FIGS. 5A, 5B, 5C, 5D, 5E, and 5F illustrate cross-sectional views respectively taken along lines A-A', B-B', C-C', D-D', E-E', and F-F' of FIG. 4.
Figure 5B:
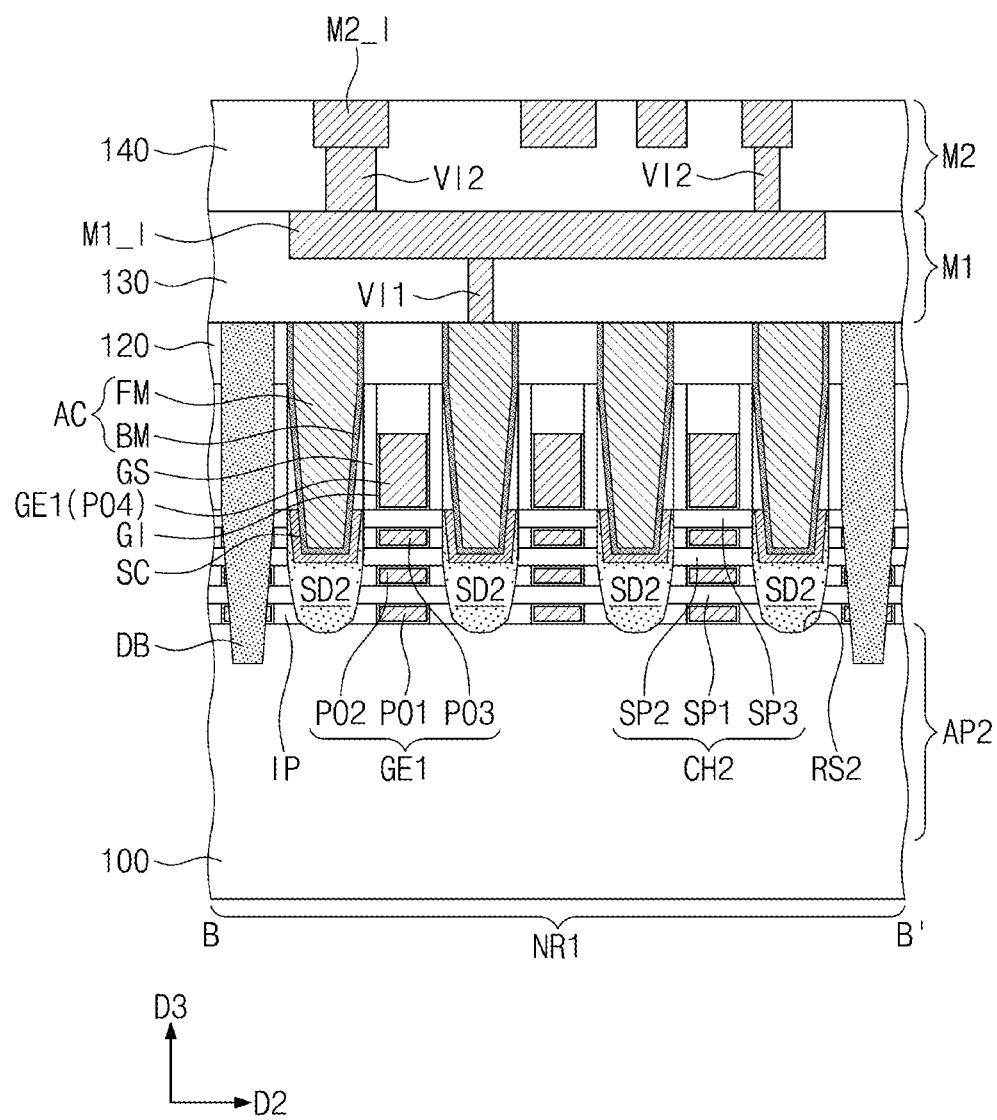
Figure 5C:
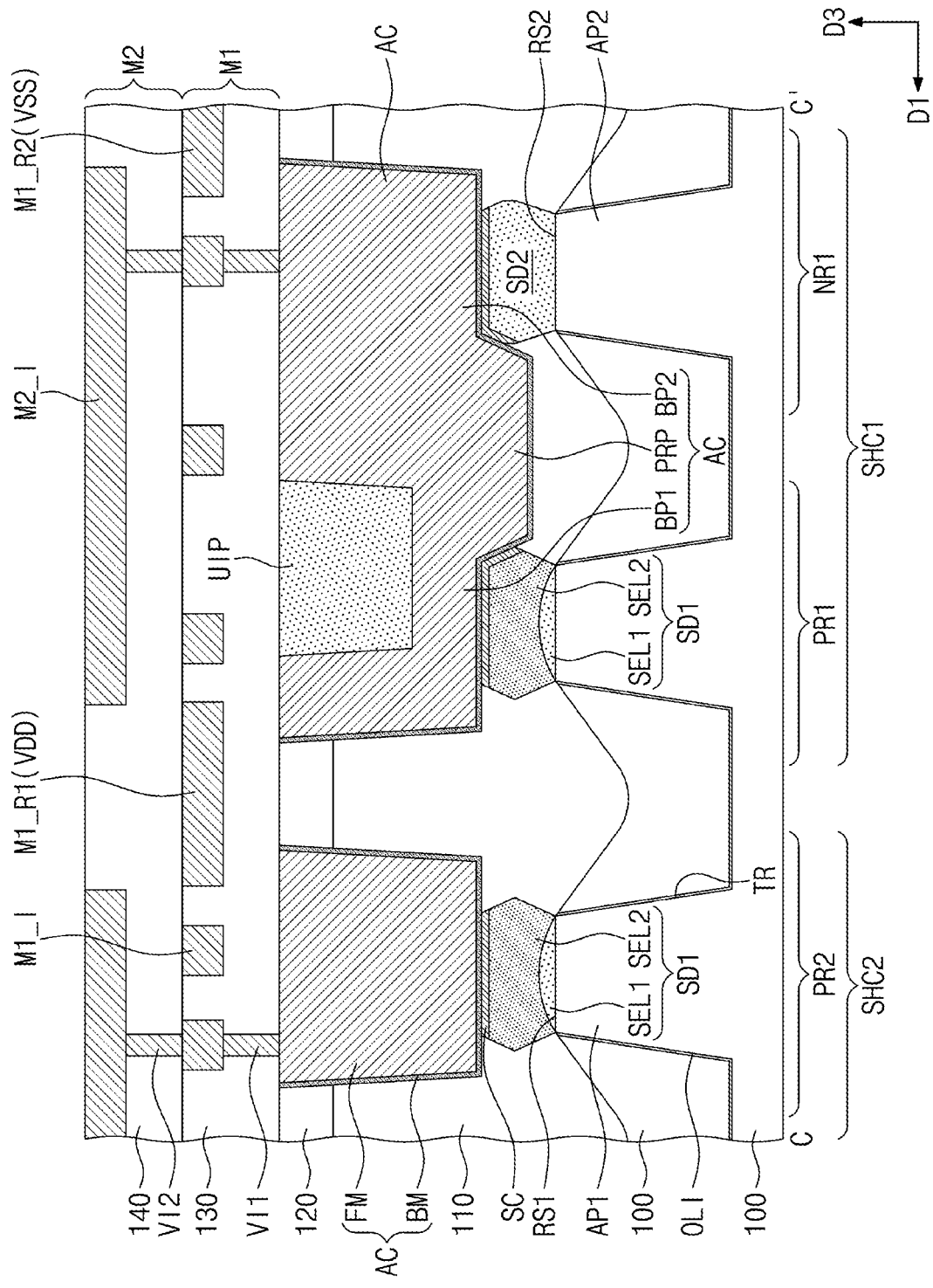
Figure 6A:
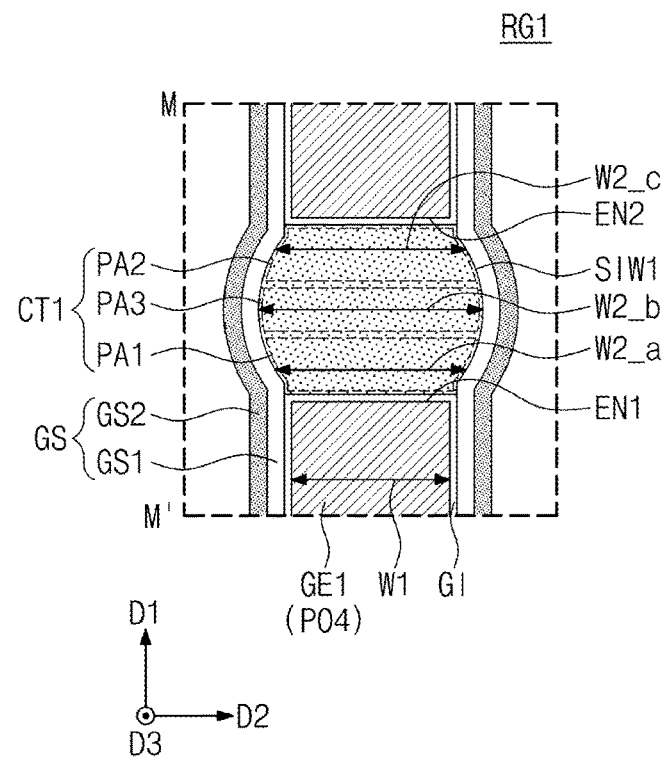
FIG. 6A illustrates a plan view taken along line M-M' of FIG. 5D.
Figure 6B:
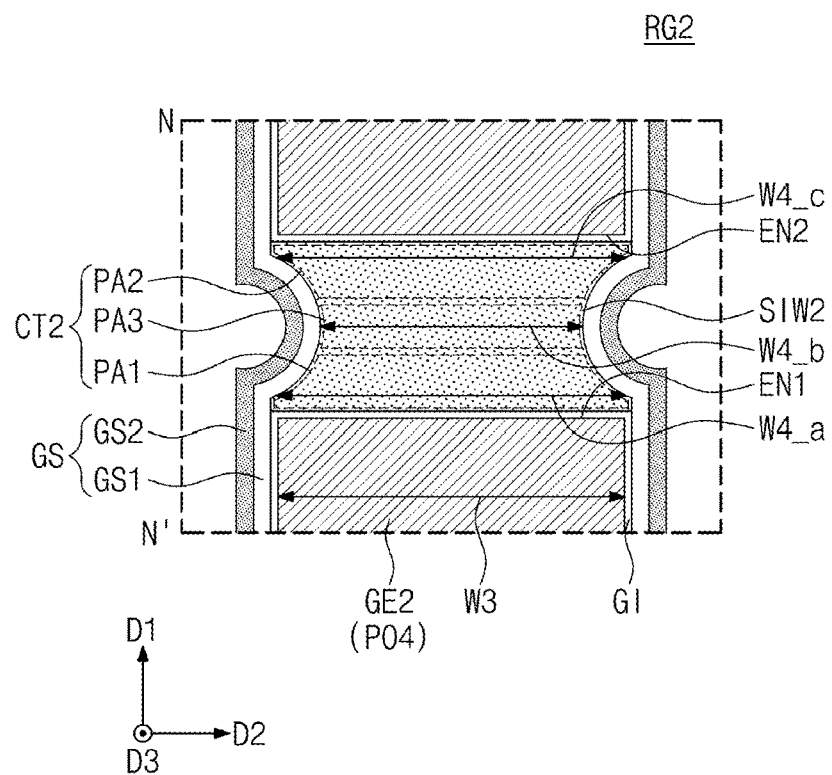
FIG. 6B illustrates a plan view taken along line N-N' of FIG. 5D.

In an implementation, referring to FIGS. 5A and 5C, the active contact AC may have an upper portion adjacent to the gate contact GC, and the upper portion of the active contact AC may be filled with an upper dielectric pattern UIP. The upper dielectric pattern UIP may have a bottom surface lower than that of the gate contact GC. In an implementation, the upper dielectric pattern UIP may cause the active contact AC adjacent to the gate contact GC to have a top surface lower than the bottom surface of the gate contact GC. In an implementation, it may be possible to prevent a short circuit resulting from contact between the gate contact GC and its adjacent active contact AC.

Each of the active contact AC and the gate contact GC may include a conductive pattern FM and a barrier pattern BM that surrounds the conductive pattern FM. In an implementation, the conductive pattern FM may include a metal, e.g., aluminum, copper, tungsten, molybdenum, or cobalt. The barrier pattern BM may cover sidewalls and a bottom surface of the conductive pattern FM. The barrier pattern BM may include a metal layer or a metal nitride layer. The metal layer may include, e.g., titanium, tantalum, tungsten, nickel, cobalt, or platinum. The metal nitride layer may include, e.g., a titanium nitride (TiN) layer, a tantalum nitride (TaN) layer, a tungsten nitride (WN) layer, a nickel nitride (NiN) layer, a cobalt nitride (CoN) layer, or a platinum nitride (PtN) layer.

A first metal layer M1 may be in the third interlayer dielectric layer 130. For example, the first metal layer M1 may include a first power line M1_R1, a second power line M1_R2, a third power line M1_R3, and first wiring lines M1_I. The lines M1_R1, M1_R2, M1_R3, and M1_I of the first metal layer M1 may extend parallel to each other in the second direction D2.

In an implementation, the first and second power lines M1_R1 and M1_R2 may be correspondingly on the third and fourth boundaries BD3 and BD4 of the first single height cell SHC1. The first power line M1_R1 may extend in the second direction D2 along the third boundary BD3. The second power line M1_R2 may extend in the second direction D2 along the fourth boundary BD4.

The first wiring lines M1_I of the first metal layer M1 may be arranged along the first direction D1 at a second pitch. The second pitch may be less than the first pitch. Each of the first wiring lines M1_I may have a line-width less than that of each of the first, second, and third power lines M1_R1, M1_R2, and M1_R3.

The first metal layer M1 may further include first vias VI1. The first vias VI1 may be correspondingly below the lines M1_R1, M1_R2, M1_R3, and M1_I of the first metal layer M1. The first via VI1 may electrically connect the active contact AC to one of the lines M1_R1, M1_R2, M1_R3, and M1_I of the first metal layer M1. The first via VI1 may electrically connect the gate contact GC to one of the lines M1_R1, M1_R2, M1_R3, and M1_I of the first metal layer M1.

A wiring line and its underlying first via VI1 of the first metal layer M1 may be formed by individual processes. In an implementation, a wiring line and its underlying first via VI1 of the first metal layer M1 may each be formed by a single damascene process. A sub-20 nm process may be employed to fabricate a semiconductor device according to some embodiments.

A second metal layer M2 may be in the fourth interlayer dielectric layer 140. The second metal layer M2 may include a plurality of second wiring lines M2_I. The second wiring lines M2_I of the second metal layer M2 may each have a linear or bar shape that extends in the first direction D1. In an implementation, the second wiring lines M2_I may parallel extend in the first direction D1.

The second metal layer M2 may further include second vias VI2 correspondingly below the second wiring lines M2_I. A wiring line of the first metal layer M1 may be electrically through the second via VI2 to a corresponding wiring line of the second metal layer M2. A wiring line and its underlying second via VI2 of the second metal layer M2 may be simultaneously formed by a dual damascene process.

The first and second metal layers M1 and M2 may have wiring lines that include the same or different conductive materials. In an implementation, the first and second metal layers M1 and M2 may have their wiring lines that include a metallic material, e.g., aluminum, copper, tungsten, molybdenum, or cobalt. In an implementation, other metal layers (e.g., M3, M4, M5, etc.) may be additionally stacked on the fourth interlayer dielectric layer 140. Each of the stacked metal layers may include wiring lines for routing between cells.

Figure 5D:
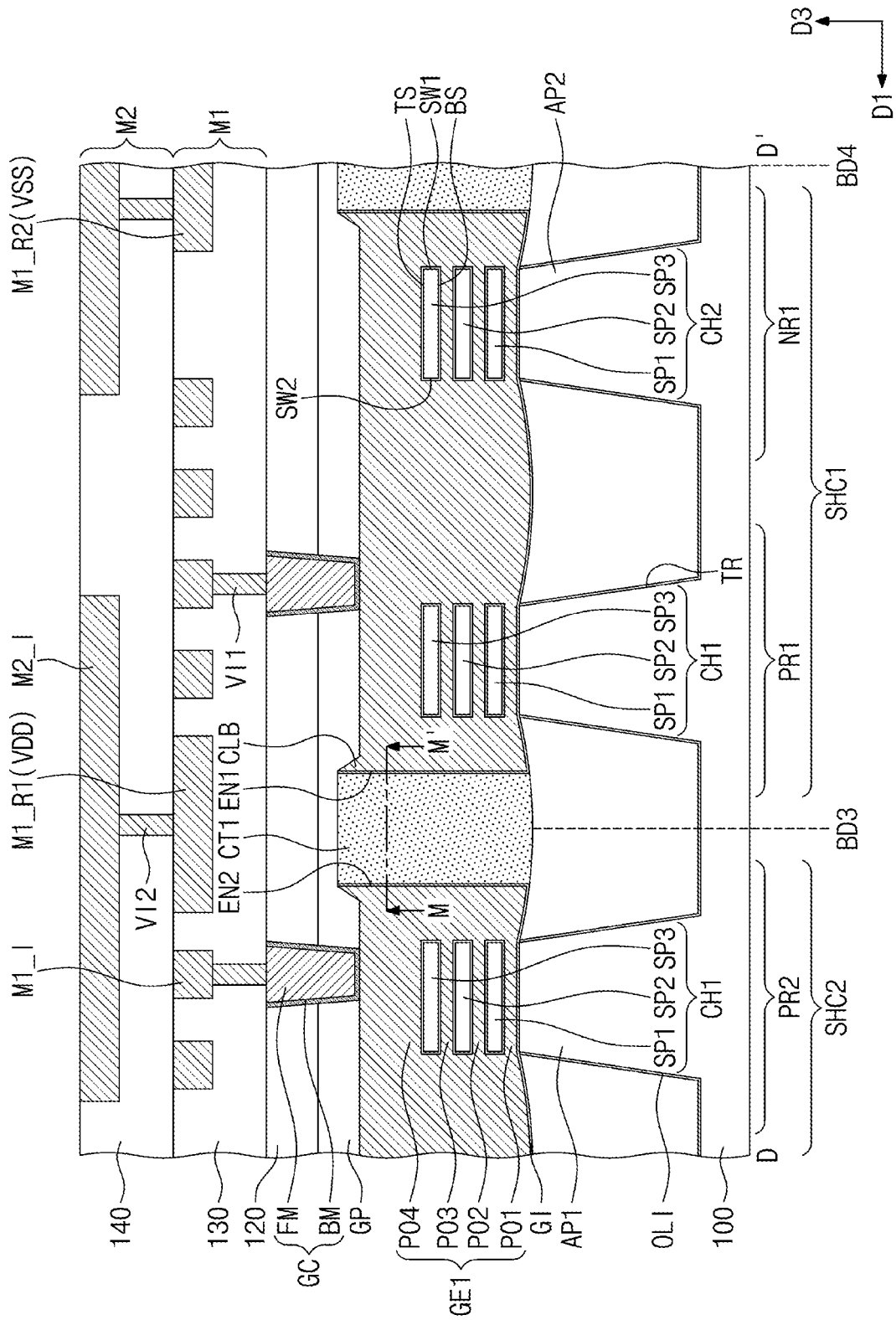
Figure 5E:
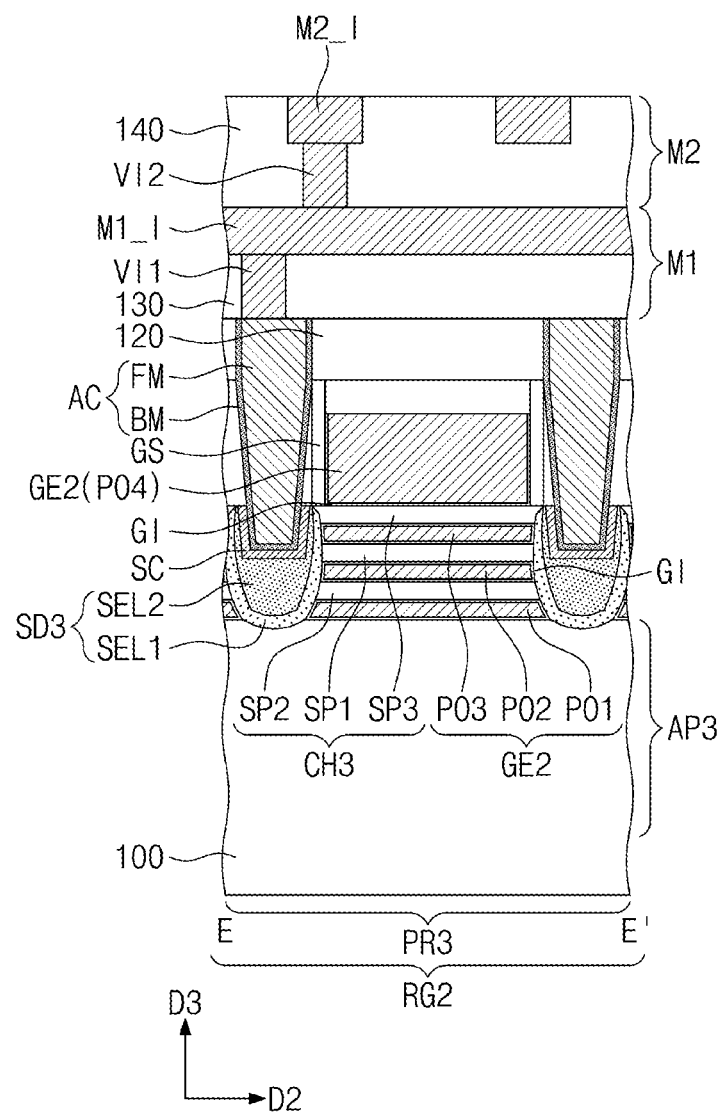
Figure 5F:
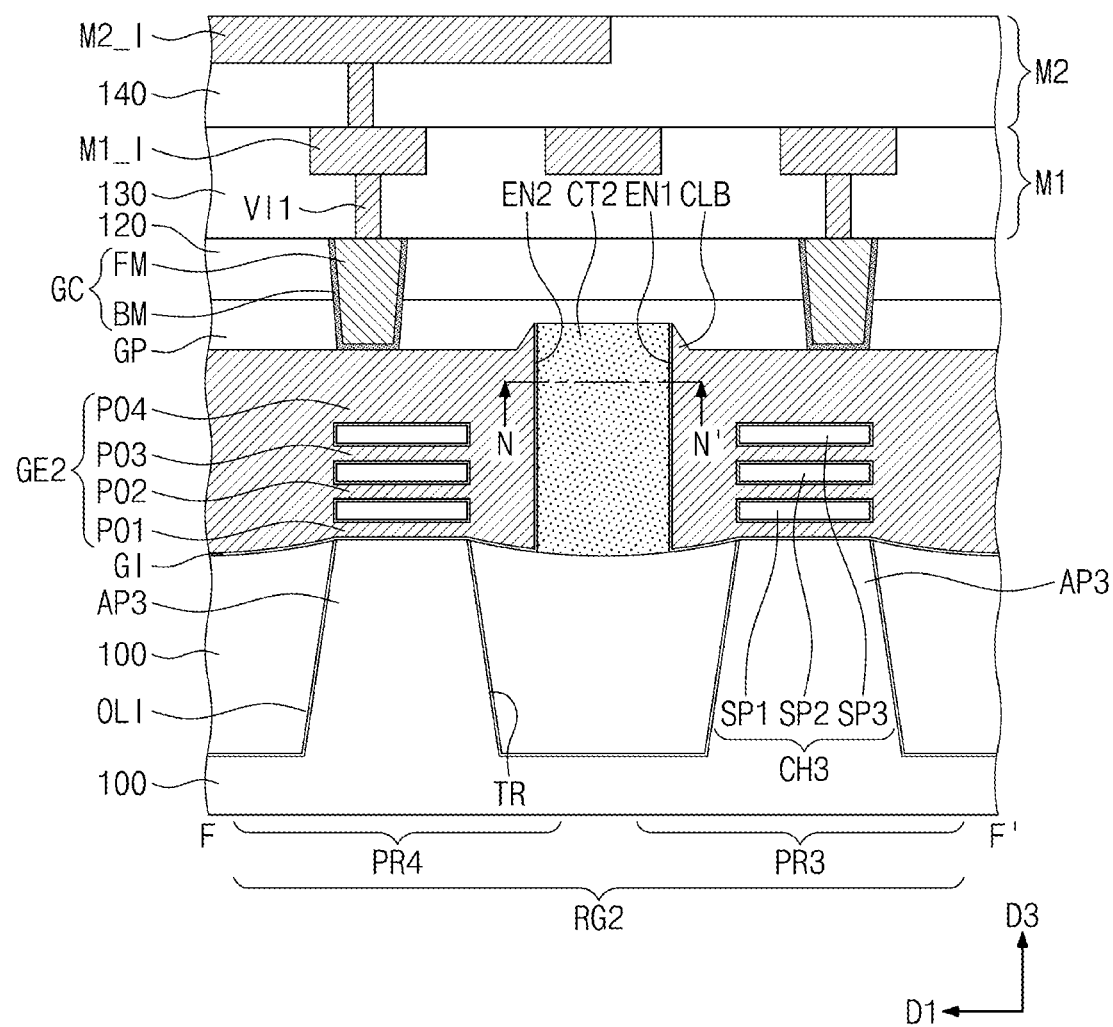

With reference to FIGS. 4, 5E, and 5F, the following will discuss in detail a transistor on the second region RG2. The second region RG2 may include, e.g., a third PMOSFET region PR3 and a fourth PMOSFET region PR4. A third active pattern AP3 may be on each of the third and fourth PMOSFET regions PR3 and PR4.

The third active pattern AP3 may be provided thereon with third source/drain patterns SD3. The third source/drain patterns SD3 may be impurity regions having the first conductivity type (e.g., p-type). A third channel pattern CH3 may be between a pair of third source/drain patterns SD3. A width in the second direction D2 of the third channel pattern CH3 may be greater than that of each of the first and second channel patterns CH1 and CH2 discussed above. The third channel pattern CH3 may include first, second, and third semiconductor patterns SP1, SP2, and SP3 that are sequentially stacked.

A second gate electrode GE2 may extend in the first direction D1 while running across the third active pattern AP3. A width in the second direction D2 of the second gate electrode GE2 may be greater than that of the first gate electrode GE1 on the first region RG1 discussed above. A gate dielectric layer GI may be between the second gate electrode GE2 and the third channel pattern CH3.

A second cutting pattern CT2 may be on the second gate electrode GE2. When viewed in plan, the second cutting pattern CT2 may be between the third PMOSFET region PR3 and the fourth PMOSFET region PR4. The second cutting pattern CT2 may separate the second gate electrode GE2 on the third PMOSFET region PR3 from the second gate electrode GE2 on the fourth PMOSFET region PR4.

The second cutting pattern CT2 may have a top surface higher than that of the second gate electrode GE2. The second gate electrode GE2 on the third PMOSFET region PR3 may have a first end EN1 that faces the second cutting pattern CT2. In an implementation, the first end EN1 of the second gate electrode GE2 may include a climbing portion CLB.

With reference to FIGS. 4, 6A, and 6B, the following will discuss in detail planar shapes of the first and the second cutting patterns CT1 and CT2. A line M-M' of FIG. 5D may be at a higher level than that of an uppermost semiconductor pattern, or the third semiconductor pattern SP3. FIG. 6A depicts a planar shape of the fourth part PO4 of the first gate electrode GE1 at a higher level than that of the third semiconductor pattern SP3.

Referring to FIGS. 4 and 6A, the first gate electrode GE1 on the first region RG1 may have a first width W1 in the second direction D2. The first cutting pattern CT1 on the first region RG1 may have a second width W2 in the second direction D2. The second width W2 may be greater than the first width W1.

The first cutting pattern CT1 may have a convex (e.g., outwardly protruding) profile at a sidewall SIW1 thereof. In an implementation, the second width W2 of the first cutting pattern CT1 (as measured in the second direction D2) may be changed or vary (e.g., at different points) along the first direction D1. The second width W2 (as measured in the second direction D2) of the first cutting pattern CT1 may increase to a maximum value and then decrease, in or along the first direction D1 from the first end EN1 of the first gate electrode GE1 toward the second end EN2 of the first gate electrode GE1.

The first cutting pattern CT1 may include a first part PA1 adjacent to the first end EN1 of the first gate electrode GE1, a second part PA2 adjacent to the second end EN2 of the first gate electrode GE1, and a third part PA3 between the first part PA1 and the second part PA2. The third part PA3 may have a width W2_b that is a maximum width of the first cutting pattern CT1. The width W2_b of the third part PA3 may be greater than a width W2_a of the first part PA1 and may be greater than a width W2_b of the second part PA2.

The gate spacer GS may be on a sidewall of each of the first gate electrode GE1 and the first cutting pattern CT1. The gate spacer GS may include a first spacer GS1 and a second spacer GS2 on the first spacer GS1. Each of the first and second spacers GS1 and GS2 may include a silicon-containing dielectric material. In an implementation, the first spacer GS1 may include a silicon-containing low-k dielectric material, e.g., SiCON. The second spacer GS2 may include a silicon-containing dielectric material with excellent resistance to etching, e.g., SiN. The gate spacer GS may have a linear shape that extends in the first direction D1 and convexly bends on the sidewall SIW1 of the first cutting pattern CT1 (e.g., may have a conformal shape on the convex sidewall SIW1 of the first cutting pattern CT1).

As a comparative example, if a first cutting pattern were to have a width substantially the same as that of the first gate electrode GE1, process scaling could cause the first cutting pattern to have a relatively very small width (e.g., less than about 20 nm). If the first cutting pattern were to have a relatively small width, the first cutting pattern may not completely penetrate the first gate electrode GE1. Therefore, short-circuit failure may be generated due to connection between the first gate electrode GE1 on the first single height cell SHC1 and the first gate electrode GE1 on the second single height cell SHC2.

According to the present embodiment, the width W2 of the first cutting pattern CT1 may be larger than the width W1 of the first gate electrode GE1. A relative increase in width of the first cutting pattern CT1 may permit the first cutting pattern CT1 to completely penetrate the first gate electrode GE1. The first cutting pattern CT1 according to the present embodiment may completely separate the first gate electrode GE1 on the first single height cell SHC1 from the first gate electrode GE1 on the second single height cell SHC2. Therefore, it may be possible to prevent the short-circuit failure and to increase reliability of semiconductor devices.

A line N-N' of FIG. 5F may be at a higher level than that of an uppermost semiconductor pattern, or the third semiconductor pattern SP3. FIG. 6B depicts a planar shape of the fourth part PO4 of the second gate electrode GE2 at a higher level than that of the third semiconductor pattern SP3.

Referring to FIGS. 4 and 6B, the second gate electrode GE2 on the second region RG2 may have a third width W3 in the second direction D2. The second cutting pattern CT2 on the second region RG2 may have a fourth width W4 in the second direction D2. The third width W3 may be less than the fourth width W4.

The second cutting pattern CT2 may have a concave profile (e.g., may be inwardly recessed) at a sidewall SIW2 thereof. The sidewall SIW2 of the second cutting pattern CT2 may have a profile opposite to that of the sidewall SIW1 of the first cutting pattern CT1 discussed above with reference to FIG. 6A. The fourth width W4 (as measured in the second direction D2) of the second cutting pattern CT2 may be changed or vary (e.g., at different points) along the first direction D1.

The fourth width W4 of the second cutting pattern CT2 may decrease to a minimum value and then increase in or along the first direction D1 from a first end EN1 of the second gate electrode GE2 toward a second end EN2 of the second gate electrode GE2. The second cutting pattern CT2 may include a first part PA1 adjacent to the first end EN1 of the second gate electrode GE2, a second part PA2 adjacent to the second end EN2 of the second gate electrode GE2, and a third part PA3 between the first part PA1 and the second part PA2. The third part PA3 may have a width W4_b that is a minimum width of the second cutting pattern CT2. The width W4_b of the third part PA3 may be less than a width W4_a of the first part PA1 and may be less than a width W4_c of the second part PA2.

The gate spacer GS may be on a sidewall of each of the second gate electrode GE2 and the second cutting pattern CT2. The gate spacer GS may include a first spacer GS1 and a second spacer GS2 on the first spacer GS1. The gate spacer GS may have a linear shape that extends in the first direction D1 and concavely bends on the sidewall SIW2 of the second cutting pattern CT2 (e.g., may have a conformal shape on the concave sidewall SIW2 of the second cutting pattern CT2).

As a comparative example, if a second cutting pattern were to have a width substantially the same as that of the second gate electrode GE2, the second cutting pattern may have a relatively large width (e.g., greater than about 80 nm). If the second cutting pattern were to have a relatively large width, a gate metallic material may remain on a lower sidewall of the second cutting pattern. Therefore, short-circuit failure may be generated due to connection between the second gate electrode GE2 on the third PMOSFET region PR3 and the second gate electrode GE2 on the fourth PMOSFET region PR4.

According to the present embodiment, the width W4 of the second cutting pattern CT2 may be smaller than the width W3 of the second gate electrode GE2. A relative reduction in width of the second cutting pattern CT2 has may help prevent a metallic material from remaining on a lower sidewall of the second cutting pattern CT2. Therefore, it may be possible to prevent the short-circuit failure and to increase reliability of semiconductor devices.

Figure 7:
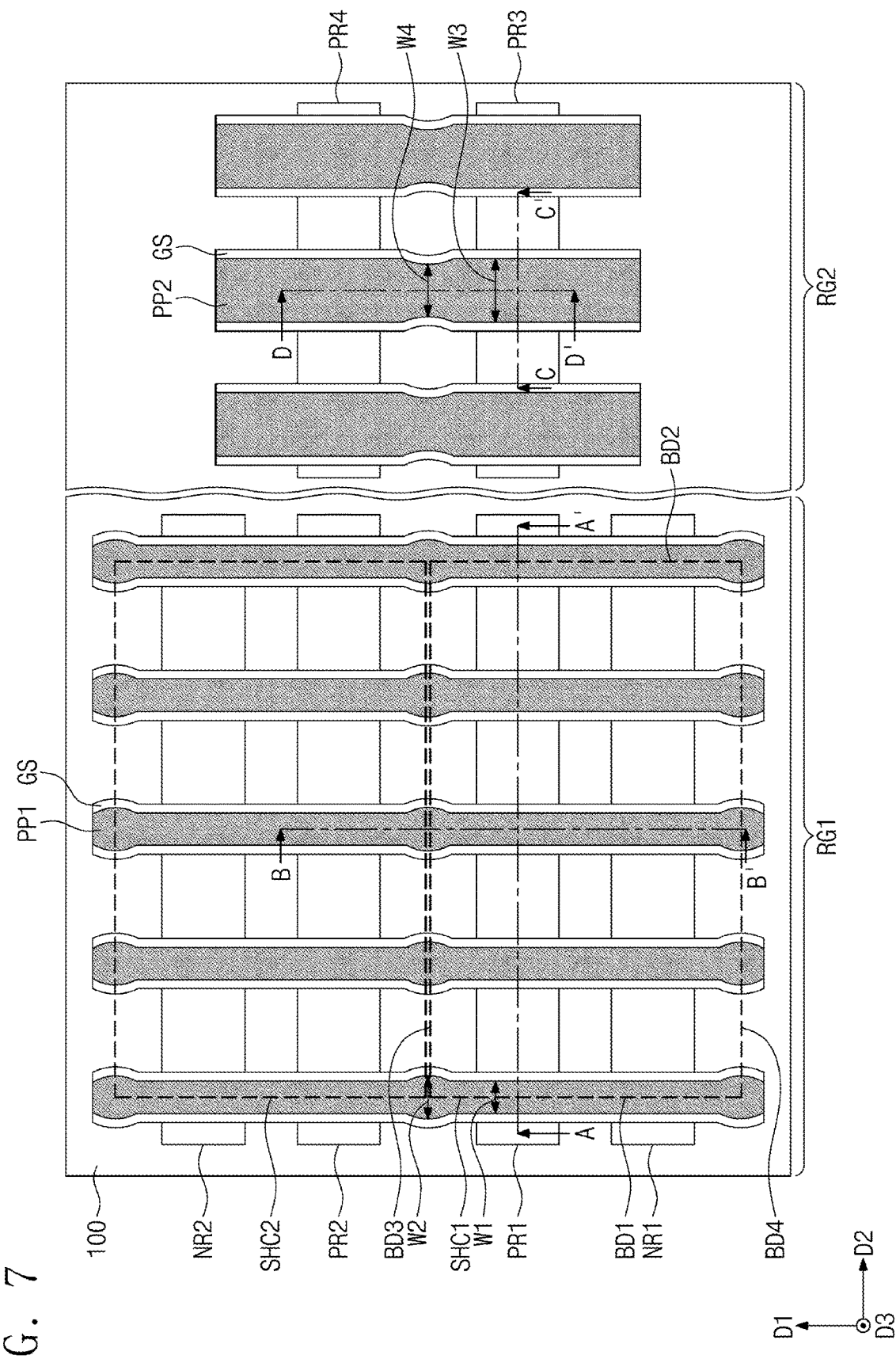
FIGS. 7 and 9 illustrate plan views of stages in a method of fabricating a semiconductor device according to some embodiments.
Figure 8A:
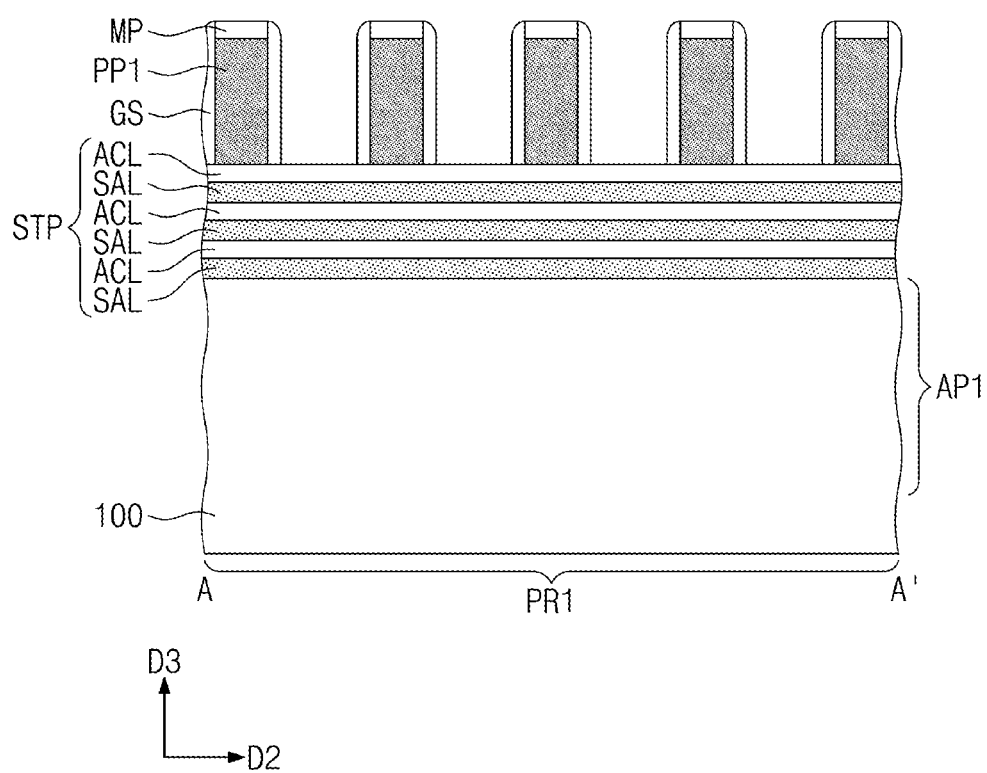
FIGS. 8A and 10A illustrate cross-sectional views taken along line A-A' of FIGS. 7 and 9, respectively.
Figure 8B:
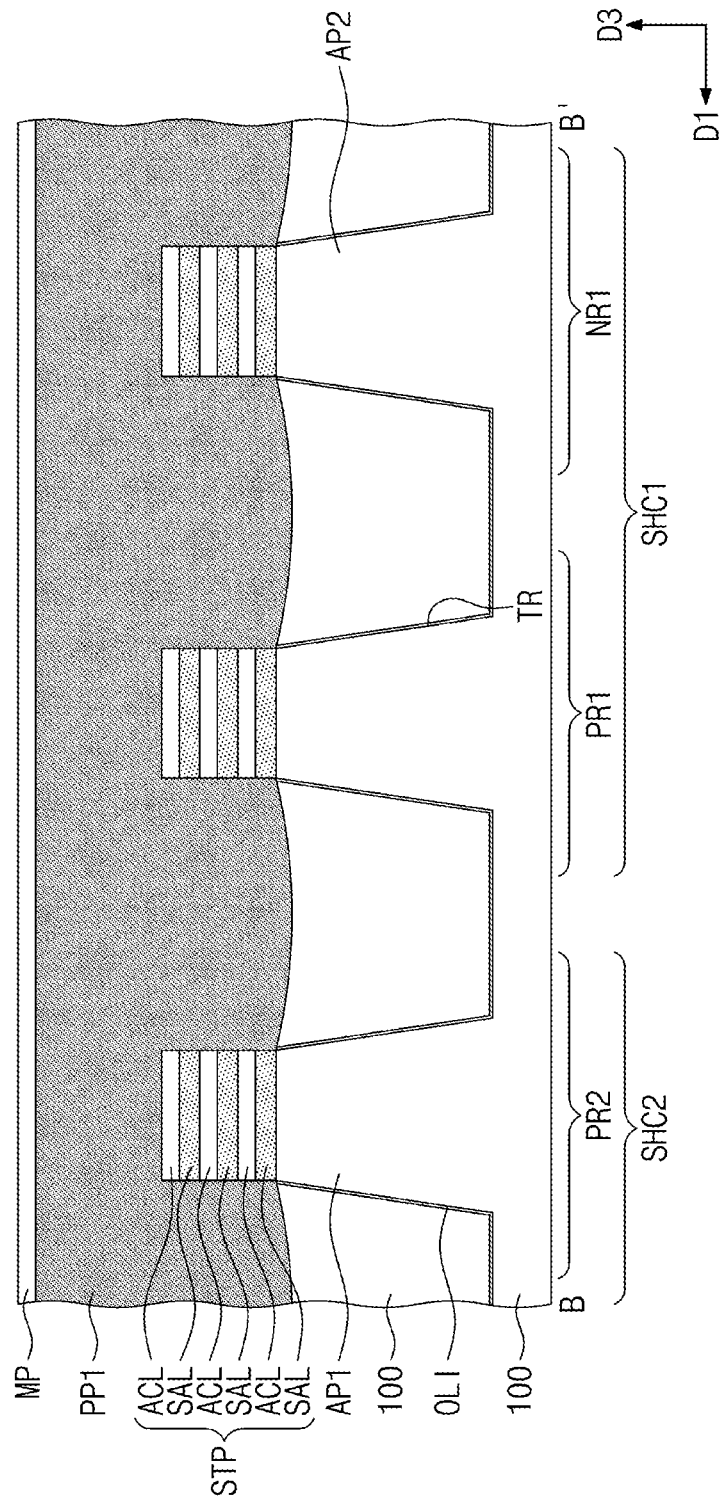
FIGS. 8B and 10B illustrate cross-sectional views taken along line B-B' of FIGS. 7 and 9, respectively.
Figure 8C:
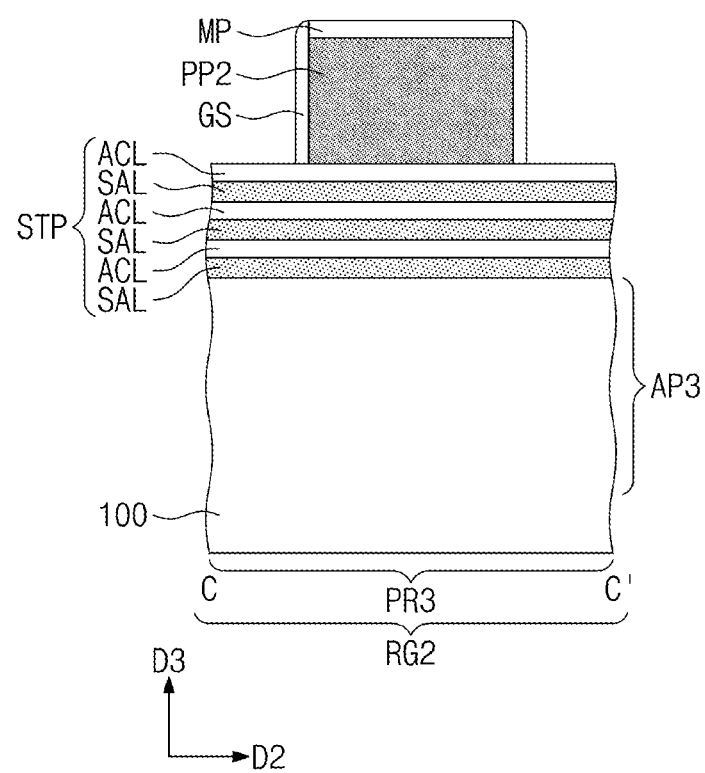
FIGS. 8C and 10C illustrate cross-sectional views taken along line C-C' of FIGS. 7 and 9, respectively.
Figure 8D:
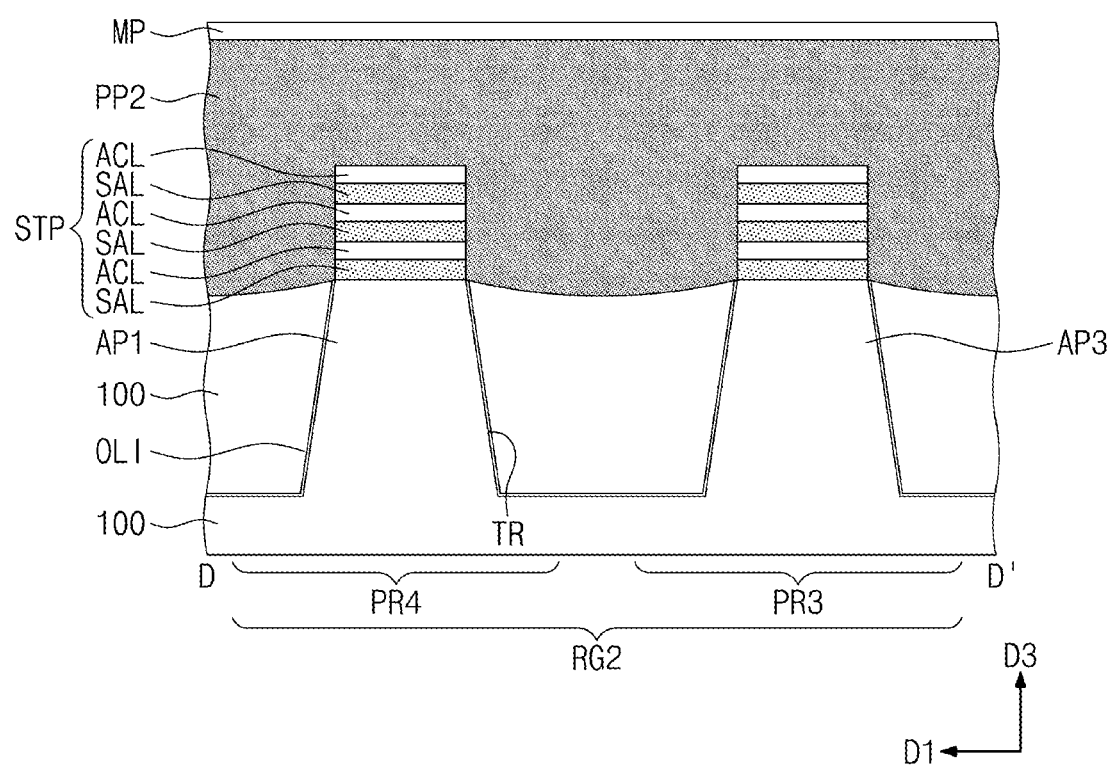
FIGS. 8D and 10D illustrate cross-sectional views taken along line D-D' of FIGS. 7 and 9, respectively.
Figure 9:
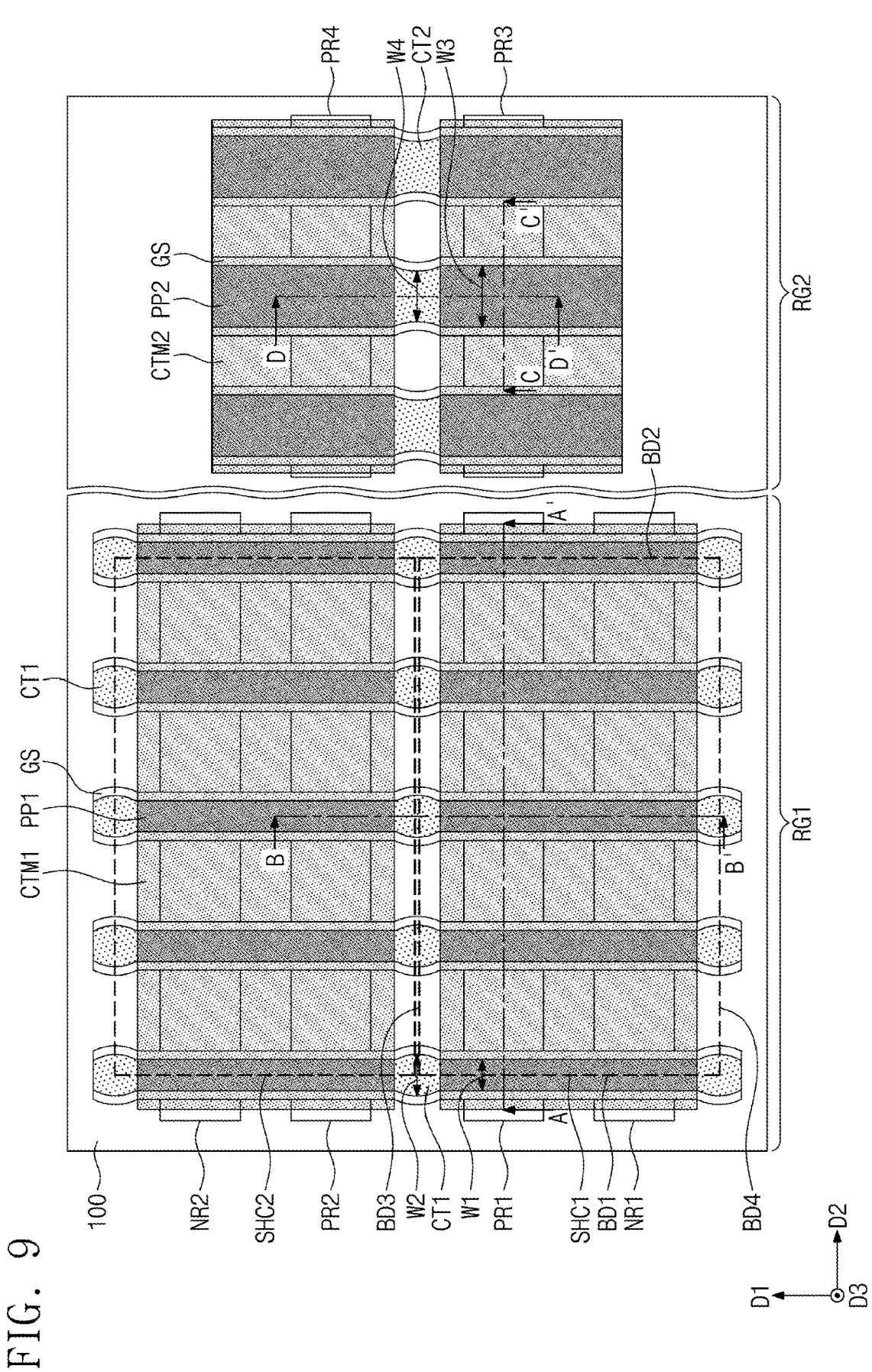
Figure 10A:
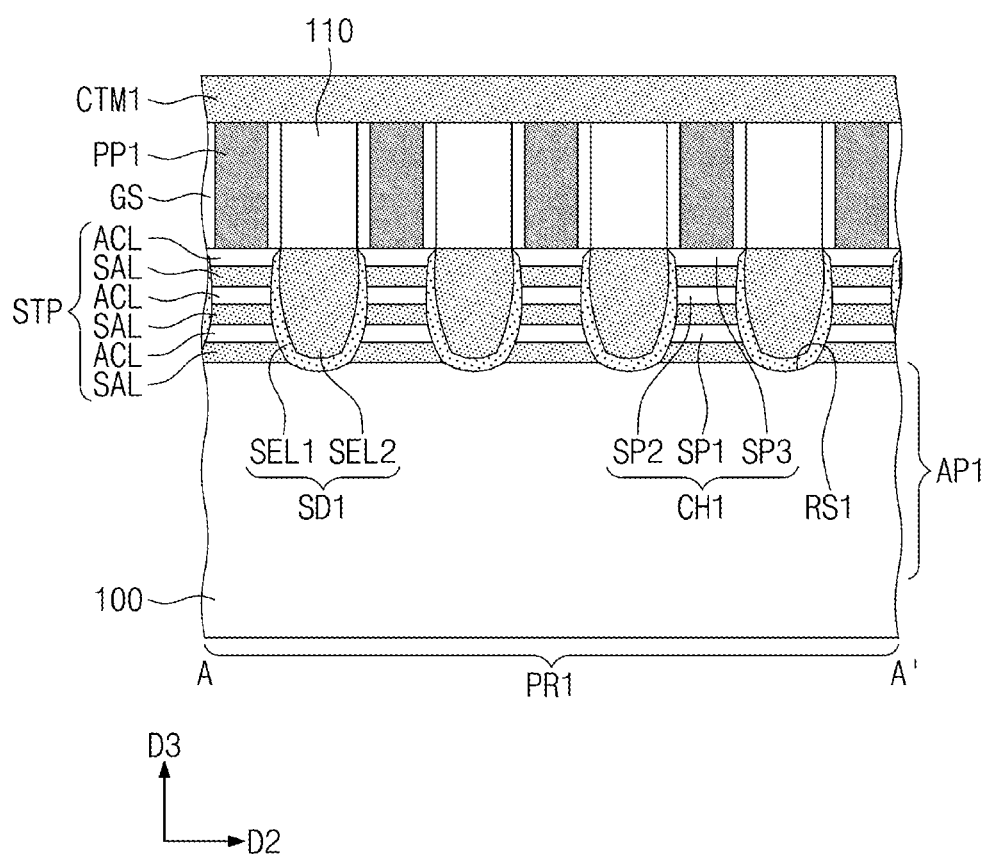
Figure 10B:
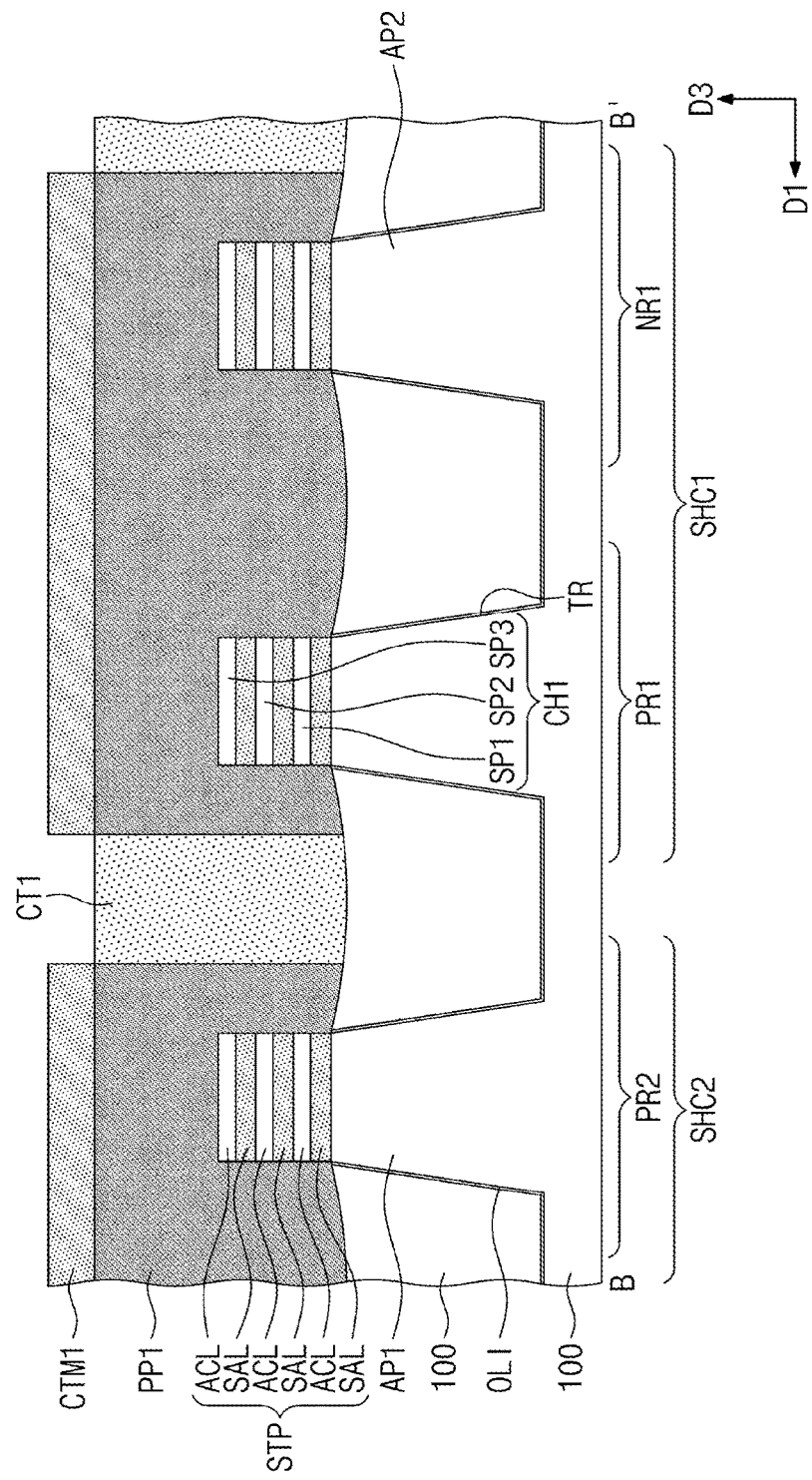
Figure 10C:
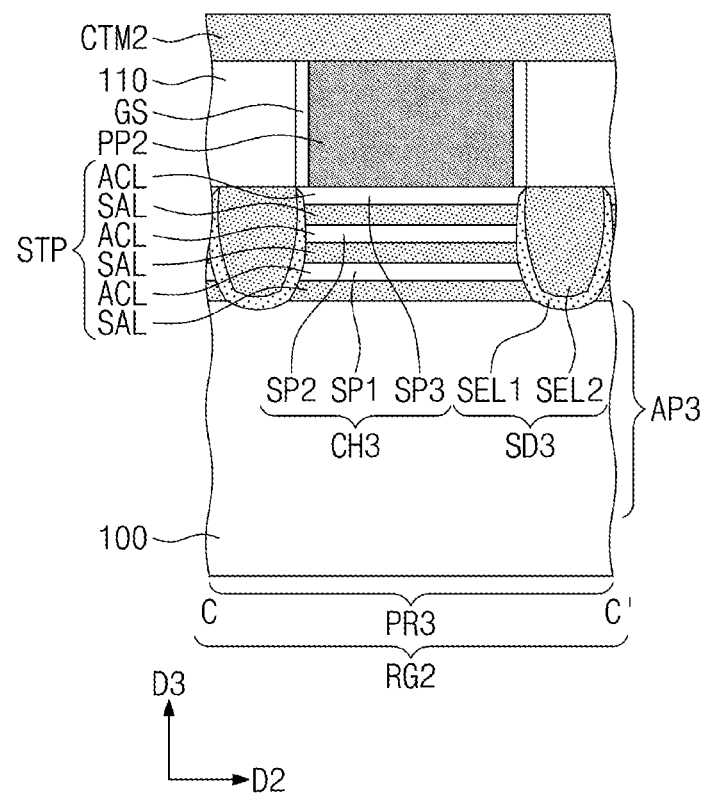
Figure 10D:
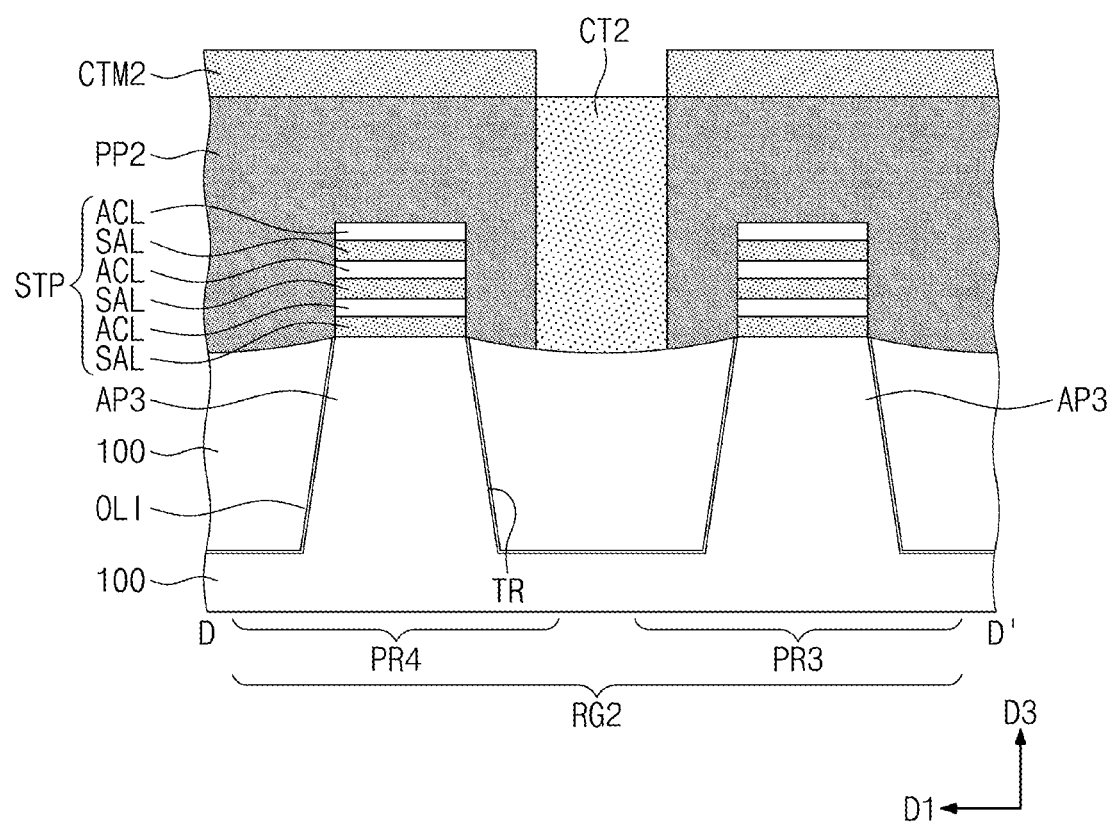

FIGS. 7 and 9 illustrate plan views of stages in a method of fabricating a semiconductor device according to some embodiments. FIGS. 8A and 10A illustrate cross-sectional views taken along line A-A' of FIGS. 7 and 9, respectively. FIGS. 8B and 10B illustrate cross-sectional views taken along line B-B' of FIGS. 7 and 9, respectively. FIGS. 8C and 10C illustrate cross-sectional views taken along line C-C' of FIGS. 7 and 9, respectively. FIGS. 8D and 10D illustrate cross-sectional views taken along line D-D' of FIGS. 7 and 9, respectively.

Referring to FIGS. 7 and 8A to 8D, a substrate 100 may include a first region RG1 and a second region RG2. The first region RG1 may include a first PMOSFET region PR1, a second PMOSFET region PR2, a first NMOSFET region NR1, and a second NMOSFET region NR2. The first NMOSFET region NR1 and the first PMOSFET region PR1 may define a first single height cell SHC1, and the second NMOSFET region NR2 and the second PMOSFET region PR2 may define a second single height cell SHC2. The first region RG1 may be a logic cell region. The second region RG2 may include, e.g., a third PMOSFET region PR3 and a fourth PMOSFET region PR4. The second region RG2 may be a core/peripheral region.

Sacrificial layers SAL and active layers ACL may be alternately formed and stacked on the substrate 100. The sacrificial layers SAL may include, e.g., one of silicon (Si), germanium (Ge), or silicon-germanium (SiGe), and the active layers ACL may include, e.g., another of silicon (Si), germanium (Ge), and silicon-germanium (SiGe).

In an implementation, the sacrificial layers SAL may include silicon-germanium (SiGe), and the active layers ACL may include silicon (Si). Each of the sacrificial layers SAL may have a germanium concentration of about 10 at % to about 30 at %.

The first region RG1 and the second region RG2 of the substrate 100 may undergo a patterning process to form a trench TR that defines first to third active patterns AP1 to AP3. The first active patterns AP1 may be formed on the first and second PMOSFET regions PR1 and PR2. The second active patterns AP2 may be formed on the first and second NMOSFET regions NR1 and NR2. The third active patterns AP3 may be formed on the third and fourth PMOSFET regions PR3 and PR4.

A stack pattern STP may be formed on each of the first to third active patterns AP1 to AP3. The stack pattern STP may include the sacrificial layers SAL and the active layers ACL that are alternately stacked. During the patterning process, the stack pattern STP may be formed simultaneously with a corresponding one of the first to third active patterns AP1 to AP3.

A device isolation layer ST may be formed to fill the trench TR. In an implementation, a dielectric layer may be formed on an entire surface of the substrate 100 to over the first to third active patterns AP1 to AP3 and the stack patterns STP. The dielectric layer may be recessed until the stack patterns STP are exposed, and thus the device isolation layer ST may be formed. The device isolation layer ST may include a dielectric material, e.g., a silicon oxide layer. The stack patterns STP may be exposed from the device isolation layer ST. In an implementation, the stack patterns STP may vertically protrude upwards from the device isolation layer ST.

On the first region RG1, first sacrificial patterns PP1 may be formed to run across the stack patterns STP on the first and second active patterns AP1 and AP2. On the second region RG2, second sacrificial patterns PP2 may be formed to run across the stack pattern STP on the third active pattern AP3. The first sacrificial pattern PP1 and the second sacrificial patterns PP2 may be formed to have their linear or bar shapes that extend in a first direction D1. The first sacrificial pattern PP1 may be formed to have a width greater than that of the second sacrificial pattern PP2.

In an implementation, the formation of the first and second sacrificial patterns PP1 and PP2 may include forming a sacrificial layer on the entire surface of the substrate 100, forming hardmask patterns MP on the sacrificial layer, and using the hardmask patterns MP as an etching mask to pattern the sacrificial layer. The sacrificial layer may include polysilicon.

In an implementation, the hardmask patterns MP that define the first and second sacrificial patterns PP1 and PP2 may be formed by a lithography process that uses an extreme ultraviolet (EUV) radiation. In this description, the EUV may mean an ultraviolet ray having a wavelength of, e.g., about 4 nm to about 124 nm, about 4 nm to about 20 nm, or about 13.5 nm. The EUV may denote light whose energy is in the range of about 6.21 eV to about 124 eV, e.g., about 90 eV to about 95 eV.

The lithography process using the EUV may include exposure and development processes in which the EUV is irradiated onto a photoresist layer. In an implementation, the photoresist layer may be an organic photoresist that contains an organic polymer, e.g., polyhydroxystyrene. The organic photoresist may further include a photosensitive compound that is sensitive to the EUV. The organic photoresist may additionally include a material whose EUV absorption coefficient is high, e.g., an organometallic material, an iodine-containing material, or a fluorine-containing material. In an implementation, the photoresist layer may be an inorganic photoresist that contains an inorganic material, e.g. tin oxide.

The photoresist layer may be formed to have a relatively small thickness. The photoresist layer exposed to the EUV may be developed to form photoresist patterns. In an implementation, when viewed in plan, the photoresist patterns may have a linear shape that extends in one direction, an island shape, a zigzag shape, a honeycomb shape, or a circular shape.

The photoresist patterns may be used as an etching mask to pattern one or more mask layers that are stacked thereunder, and thus the hardmask patterns MP may be formed as discussed above. The hardmask patterns MP may be used as an etching mask to pattern a target layer or the sacrificial layer to form on a wafer a plurality of patterns or the first and second sacrificial patterns PP1 and PP2.

As a comparative example, a multi-patterning technique (MPT) may require the use of two or more photomasks to form fine-pitched patterns on a wafer. In contrast, when an EUV lithography process is performed according to some embodiments, even a single photomask may form the first and second sacrificial patterns PP1 and PP2 having fine pitches.

In an implementation, a value equal to or less than about 45 nm may be given as a minimum pitch between the first and second sacrificial patterns PP1 and PP2 that are formed by the EUV lithography process according to the present embodiment. The EUV lithography process may be performed to form the first and second sacrificial patterns PP1 and PP2 that are sophisticated and fine, even without the multi-patterning process.

According to the present embodiment, the EUV lithography process may be employed to freely achieve shapes of the first and second sacrificial patterns PP1 and PP2. In an implementation, the first sacrificial pattern PP1 may have a uniform width W1 and then an increased width, or a second width W2, on a first part. The first part may not overlap any of the regions PR1, PR2, NR1, and NR2. The first part may be an area where a first cutting pattern CT1 will be subsequently formed. In an implementation, the second sacrificial pattern PP2 may have a uniform width W3 and then a reduced width, or a fourth width W4, on a second part. The second part may not overlap any of the regions PR3 and PR4. The second part may be an area where a second cutting pattern CT2 will be subsequently formed.

Differently from the present embodiment, the multi-patterning technique (MPT) according to the comparative example may be difficult to freely achieve shapes of the first and second sacrificial patterns PP1 and PP2. Therefore, according to the comparative example, each of the first and second sacrificial patterns PP1 and PP2 may be difficult to form a portion whose line-width is temporally increased or reduced.

According to some embodiments, the EUV lithography process may be used to perform not only the patterning process for forming the first and second sacrificial patterns PP1 and PP2, but the patterning process for forming the first to third active patterns AP1 to AP3.

A pair of gate spacers GS may be formed on opposite sidewalls of each of the first and second sacrificial patterns PP1 and PP2. The formation of the gate spacers GS may include conformally forming a gate spacer layer on the entire surface of the substrate 100 and anisotropically etching the gate spacer layer. As shown in FIGS. 6A and 6B, the formation of the gate spacer GS may include forming a first spacer GS1 and a second spacer GS2.

Referring to FIGS. 9 and 10A to 10D, first to third source/drain patterns SD1 to SD3 may be respectively formed on the first to third active patterns AP1 to AP3. In an implementation, the first source/drain patterns SD1 may be formed on an upper portion of the first active pattern AP1. A pair of first source/drain patterns SD1 may be formed on opposite sides of the first sacrificial pattern PP1.

In an implementation, the hardmask patterns MP and the gate spacers GS may be used as an etching mask to etch the stack pattern STP on the first active pattern AP1, thereby forming first recesses RS1. The active layers ACL of the stack pattern STP may be formed into first, second, and third semiconductor patterns SP1, SP2, and SP3 that are sequentially stacked between neighboring first recesses RS1. A first channel pattern CH1 may be constituted by the first, second, and third semiconductor patterns SP1, SP2, and SP3 between neighboring first recesses RS1.

A first selective epitaxial growth (SEG) process may be performed in which an inner wall of the first recess RS1 of the stack pattern STP is used as a seed layer to form a first semiconductor layer SEL1. The first, second, and third semiconductor patterns SP1, SP2, and SP3 and the substrate 100 that are exposed to the first recess RS1 may be used as a seed from which the first semiconductor layer SEL1 is grown. In an implementation, the first SEG process may include chemical vapor deposition (CVD) or molecular beam epitaxy (MBE).

The first semiconductor layer SEL1 may include a semiconductor element (e.g., SiGe) whose lattice constant is greater than that of a semiconductor element of the substrate 100. The first semiconductor pattern SP1 may contain germanium (Ge) whose concentration is relatively low. In an implementation, the first semiconductor layer SEL1 may include only silicon (Si) and may not include germanium (Ge). The first semiconductor layer SEL1 may contain germanium (Ge) whose concentration ranges from about 0 at % to about 10 at %.

The first semiconductor layer SEL1 may undergo a second selective epitaxial growth (SEG) process to form a second semiconductor layer SEL2. The second semiconductor layer SEL2 may be formed to completely fill (e.g., remaining parts of) the first recess RS1. The second semiconductor layer SEL2 may contain germanium (Ge) whose concentration is relatively high. In an implementation, the second semiconductor layer SEL2 may contain germanium (Ge) whose concentration ranges from about 30 at % to about 70 at %.

The first semiconductor layer SEL1 and the second semiconductor layer SEL2 may constitute the first source/drain pattern SD1. Impurities may be in-situ implanted during the first and second SEG processes. In an implementation, after the first source/drain pattern SD1 is formed, impurities may be implanted into the first source/drain pattern SD1. The first source/drain pattern SD1 may be doped with impurities to have a first conductivity type (e.g., p-type).

Second source/drain patterns SD2 may be formed in the stack pattern STP on the second active pattern AP2 (see FIGS. 5B and 5C). A pair of second source/drain patterns SD2 may be formed on opposite sides of the first sacrificial pattern PP1. The formation of the second source/drain patterns SD2 may be similar to the formation of the first source/drain patterns SD1.

The third source/drain patterns SD3 may be formed in the stack pattern STP on the third active pattern AP3. A pair of third source/drain patterns SD3 may be formed on opposite sides of the second sacrificial pattern PP2. The formation of the third source/drain patterns SD3 may be similar to the formation of the first source/drain patterns SD1.

A first interlayer dielectric layer 110 may be formed to cover the first to third source/drain patterns SD1 to SD3, the hardmask patterns MP, and the gate spacers GS. For example, the first interlayer dielectric layer 110 may include a silicon oxide layer.

The first interlayer dielectric layer 110 may be planarized until top surfaces of the first and second sacrificial patterns PP1 and PP2 are exposed. An etch-back or chemical mechanical polishing (CMP) process may be employed to planarize the first interlayer dielectric layer 110. The hardmask patterns MP may all be removed during the planarization process. As a result, the first interlayer dielectric layer 110 may have a top surface coplanar with those of the first and second sacrificial patterns PP1 and PP2 and those of the gate spacers GS.

On the first region RG1, a first mask layer CTM1 may be formed which exposes areas where first cutting patterns CT1 will be formed. On the second region RG2, a second mask layer CTM2 may be formed which exposes areas where second cutting patterns CT2 will be formed. The first and second mask layers CTM1 and CTM2 may be formed by a photolithography process. In an implementation, the first and second mask layers CTM1 and CTM2 may be formed together with each other.

A first cutting pattern CT1 may replace the first part of the first sacrificial pattern PP1 exposed by the first mask layer CTM1. In an implementation, the formation of the first cutting pattern CT1 may include selectively etching the first part of the first sacrificial pattern PP1 exposed by the first mask layer CTM1, and allowing a dielectric material to fill an area from which the first part has been removed. The first part may have a portion having a second width W2 greater than the width W1 of the first sacrificial pattern PP1. Therefore, the first cutting pattern CT1 may have the second width W2 greater than the width W1 of the first sacrificial pattern PP1.

According to the comparative example, if a width of the first part were to be the same as the width W1 of the first sacrificial pattern PP1, a process failure caused by incomplete removal of the first part during an anisotropic etching process that removes the first part could occur.

In contrast, according to the present embodiment, the first part may have the second width W2 greater than the width W1 of the first sacrificial pattern PP1. Therefore, the first part may be completely removed during an anisotropic etching process for removing the first part. As a result, a fabrication method according to the present embodiment may increase reliability of semiconductor devices.

A second cutting pattern CT2 may replace the second part of the second sacrificial pattern PP2 exposed by the second mask layer CTM2. In an implementation, the formation of the second cutting pattern CT2 may include selectively etching the second part of the second sacrificial pattern PP2 exposed by the second mask layer CTM2, and allowing a dielectric material to fill an area from which the second part has been removed. The second part may have a portion having a fourth width W4 less than the width W3 of the second sacrificial pattern PP2. Therefore, the second cutting pattern CT2 may have the fourth width W4 less than the width W3 of the second sacrificial pattern PP2.

According to the comparative example, if the second part were to have a width the same as the width W3 of the second sacrificial pattern PP2, the second part could have a tapered trapezoidal shape at a cross section thereof. Therefore, a process failure caused by incomplete removal of the second part during an anisotropic etching process for removing the second part could occur.

In contrast, according to the present embodiment, the second part may have the fourth width W4 less than the width W3 of the second sacrificial pattern PP2. The second part may have a rectangular shape at a cross section thereof, and as a result the second part may be completely removed. A fabrication method according to the present embodiment may increase reliability of semiconductor devices.

Subsequently, referring back to FIGS. 4 and 5A to 5F, the first and second sacrificial patterns PP1 and PP2 may be selectively removed. The removal of the first and second sacrificial patterns PP1 and PP2 may expose the sacrificial layers SAL of the stack pattern STP. The exposed sacrificial layers SAL may be selectively removed.

A gate dielectric layer GI may be conformally formed in empty spaces from which the first and second sacrificial patterns PP1 and PP2 have been removed. The empty space, from which the first sacrificial pattern PP1 has been removed, may be filled with a metallic material to form a first gate electrode GE1. The empty space, from which the second sacrificial pattern PP2 has been removed, may be filled with a metallic material to form a second gate electrode GE2. A gate capping pattern GP may be formed on each of the first and second gate electrodes GE1 and GE2.

A second interlayer dielectric layer 120 may be formed on the first interlayer dielectric layer 110. Active contacts AC may be formed to penetrate the second and first interlayer dielectric layers 120 and 110 to electrically connect with the first, second, and third source/drain patterns SD1, SD2, and SD3. Gate contacts GC may be formed to penetrate the second interlayer dielectric layer 120 and the gate capping pattern GP to electrically connect with the first and second gate electrodes GE1 and GE2.

A third interlayer dielectric layer 130 may be formed on the second interlayer dielectric layer 120. A first metal layer M1 may be formed in the third interlayer dielectric layer 130. A fourth interlayer dielectric layer 140 may be formed on the first metal layer M1. A second metal layer M2 may be formed in the fourth interlayer dielectric layer 140.

According to some embodiments, an EUV lithography process may be employed to form first wiring lines M1_I and/or second wiring lines M2_I in the first metal layer M1 and/or the second metal layer M2. A detailed description of the EUV lithography process used in BEOL processes may be substantially the same as that used for forming the first and second sacrificial patterns PP1 and PP2. In an implementation, a distance equal to or less than about 45 nm may be given as a minimum pitch between the first wiring lines M1_I formed by the EUV lithography process.

Figure 11:
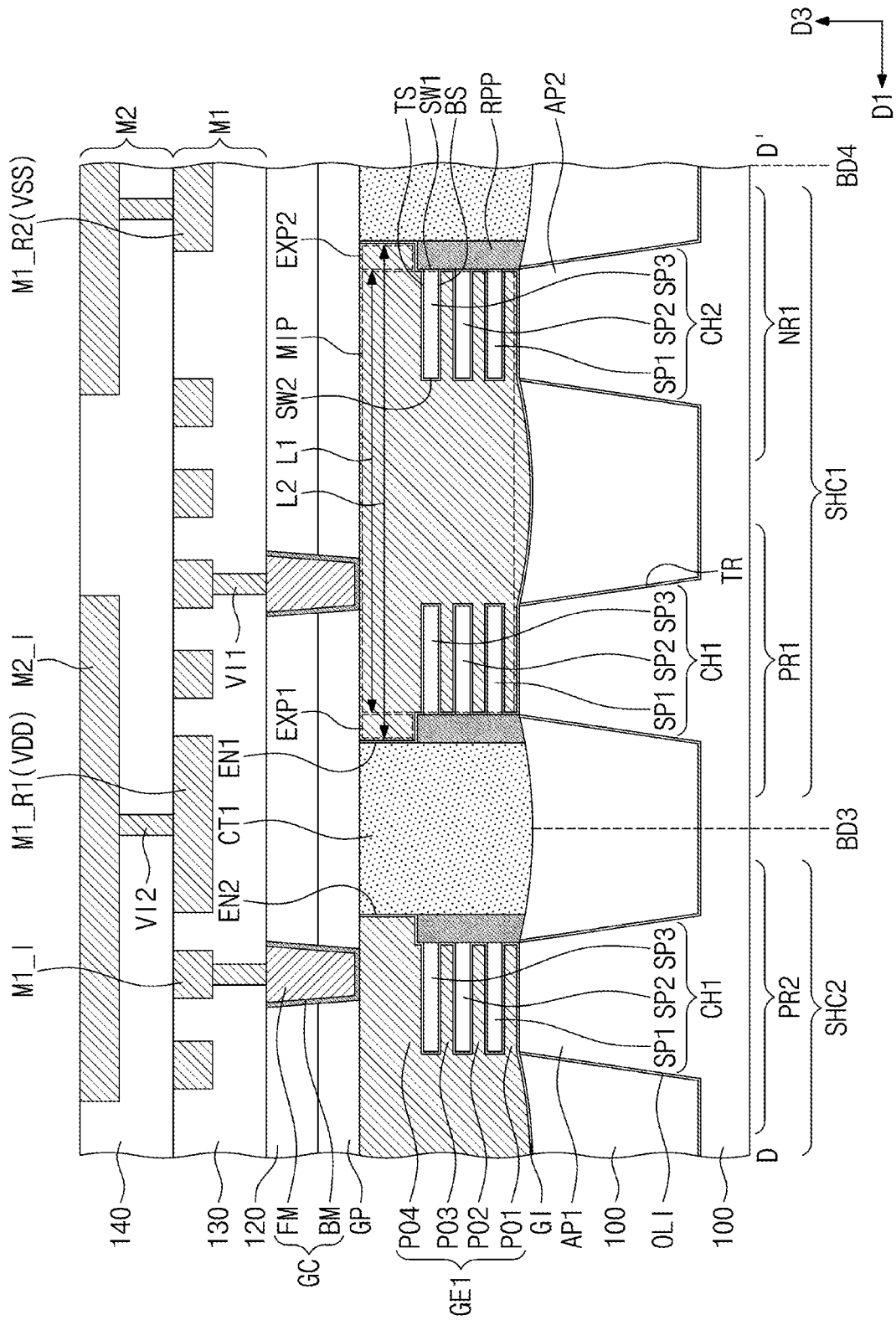
FIGS. 11 and 12 illustrate cross-sectional views taken along line D-D' of FIG. 4, of a semiconductor device according to some embodiments.
Figure 12:
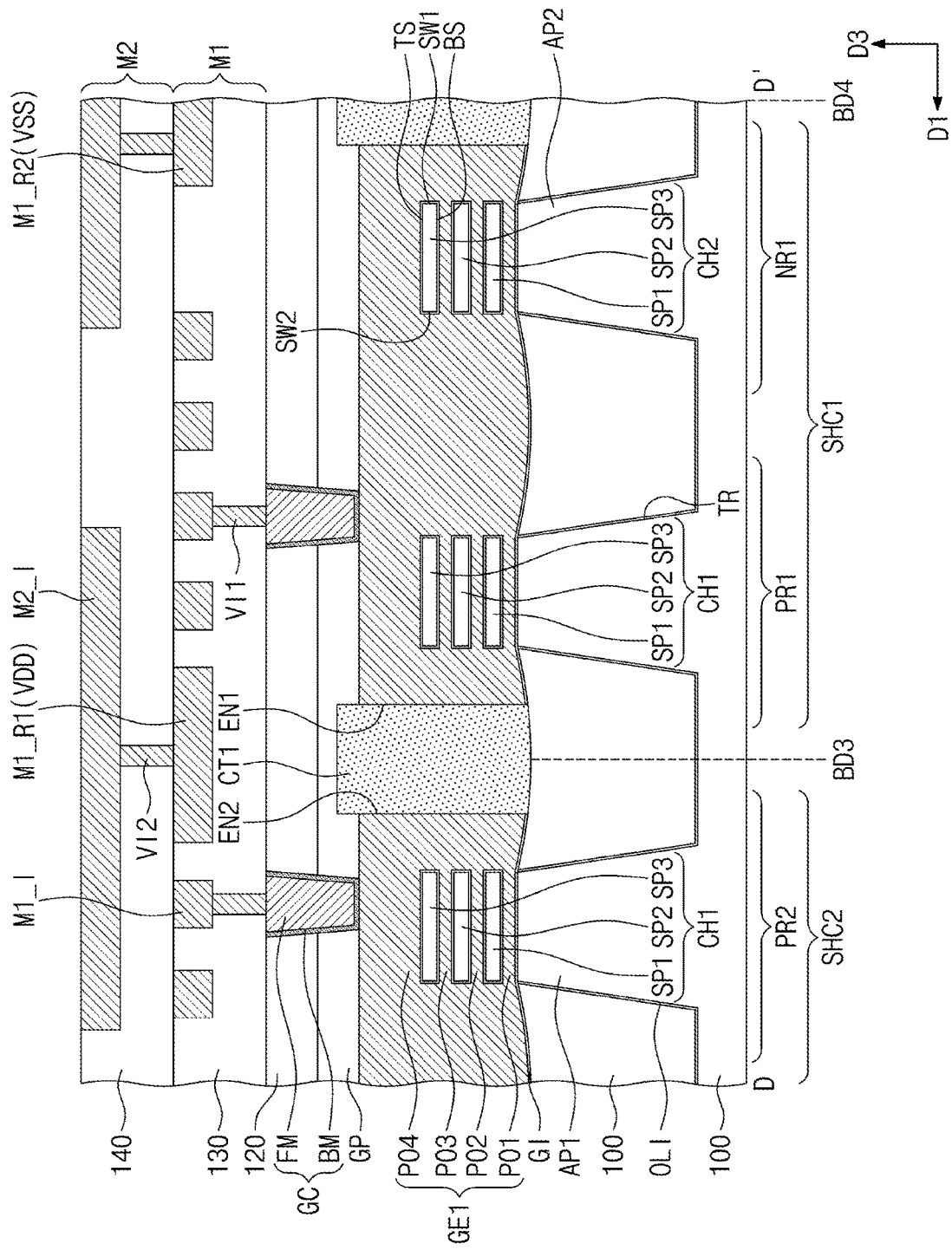

FIGS. 11 and 12 illustrate cross-sectional views taken along line D-D' of FIG. 4, of a semiconductor device according to some embodiments. In the embodiment that follows, a repeated detailed description of technical features mentioned above with reference to FIGS. 4 and 5A to 5F may be omitted, and a difference thereof will be discussed in detail.

Referring to FIGS. 4 and 11, a residual pattern RPP may be between the first cutting pattern CT1 and the first channel pattern CH1. A residual pattern RPP may also be between the first cutting pattern CT1 and the second channel pattern CH2. The residual pattern RPP may include, e.g., polysilicon, silicon oxide, or a combination thereof. In an implementation, the residual pattern RPP may include polysilicon at a first part adjacent to the channel pattern CH1 or CH2, and may also include silicon oxide at a second part adjacent to the first cutting pattern CT1.

In an implementation, each of the first, second, and third semiconductor patterns SP1, SP2, and SP3 of the first channel pattern CH1 may have a top surface TS, a first sidewall SW1, a second sidewall SW2 opposite to the first sidewall SW1, and a bottom surface BS. The second sidewall SW2 may be an outermost sidewall of a semiconductor pattern. The first gate electrode GE1 may cover the top surface TS, the first sidewall SW1, and the bottom surface BS. The first gate electrode GE1 may not cover but expose the second sidewall SW2.

The top surface TS, the bottom surface BS, and the first sidewall SW1 may be covered with the gate dielectric layer GI. The top surface TS, the bottom surface BS, and the first sidewall SW1 may face the first gate electrode GE1 across the gate dielectric layer GI. The second sidewall SW2 may not be covered with the gate dielectric layer GI. The second sidewall SW2 may be covered with the residual pattern RPP.

The residual pattern RPP may have one sidewall in direct contact with at least one of the first, second, and third semiconductor patterns SP1, SP2, and SP3, and may also have an opposite sidewall in direct contact with the first cutting pattern CT1. The one sidewall of the residual pattern RPP may have a portion that is not in contact with any of the first, second, and third semiconductor patterns SP1, SP2, and SP3, and the portion of the one sidewall may be covered with the gate dielectric layer GI.

The first gate electrode GE1 on the first single height cell SHC1 may include, at its upper portion, a first extension EXP1, a second extension EXP2, and a main part MIP between the first and second extensions EXP1 and EXP2. Each of the first and second extensions EXP1 and EXP2 may lie on and vertically overlap a corresponding one of the residual patterns RPP. Each of the first and second extensions EXP1 and EXP2 may be adjacent to the first cutting pattern CT1 across the gate dielectric layer GI.

The main part MIP may be a portion that covers the first channel pattern CH1 and the second channel pattern CH2 of the first gate electrode GE1. The main part MIP may have a first length L1 in the first direction D1. The first length L1 may be less than a second length L2 that is a distance between the first cutting pattern CT1 and its opposing first cutting pattern CT1. In an implementation, the residual patterns RPP may cause the main part MIP of the first gate electrode GE1 to have a length (e.g., the first length L1) less than a maximum length (e.g., the second length L2) of the first gate electrode GE1.

As discussed above, the first gate electrode GE1 of a semiconductor device according to the present embodiment may have the first length L1 that is relatively small. A reduction in length of the first gate electrode GE1 may decrease a volume of the first gate electrode GE1. As a result, a reduced parasitic capacitance may be provided between the first gate electrode GE1 and its adjacent active contact AC. In addition, a reduced capacitance may be provided between the first gate electrode GE1 and its adjacent first and second source/drain patterns SD1 and SD2. The reduction in parasitic capacitance may induce an increase in operating speed and electrical properties of semiconductor devices.

According to the present embodiment, each of the first and second channel patterns CH1 and CH2 may be formed of the first, second, and third semiconductor patterns SP1, SP2, and SP3 (or extremely thin nano-sheets), and thus may have a thin body structure. A semiconductor device according to the present embodiment may have fully-depleted device properties. Even when the first gate electrode GE1 according to the present embodiment does not cover the second sidewall SW2 of each of the first, second, and third semiconductor patterns SP1, SP2, and SP3 as shown in FIG. 11, no punch-through may occur between source and drain. Therefore, the first, second, and third semiconductor patterns SP1, SP2, and SP3 may operate as a normal transistor body.

In an implementation, referring to FIGS. 4 and 12, differently from that discussed with reference to FIG. 5D, the climbing portion CLB may be omitted in the first gate electrode GE1. In an implementation, the gate dielectric layer GI may not cover a sidewall of the first cutting pattern CT1. The first cutting pattern CT1 shown in FIG. 5D may be formed by allowing the first cutting pattern CT1 to replace a portion of the first sacrificial pattern PP1 as discussed above with reference to FIG. 10B. In contrast, the first cutting pattern CT1 according to the present embodiment may be formed by forming the gate dielectric layer GI and the first gate electrode GE1 and then replacing a portion of the first gate electrode GE1 with the first cutting pattern CT1.

Figure 13:
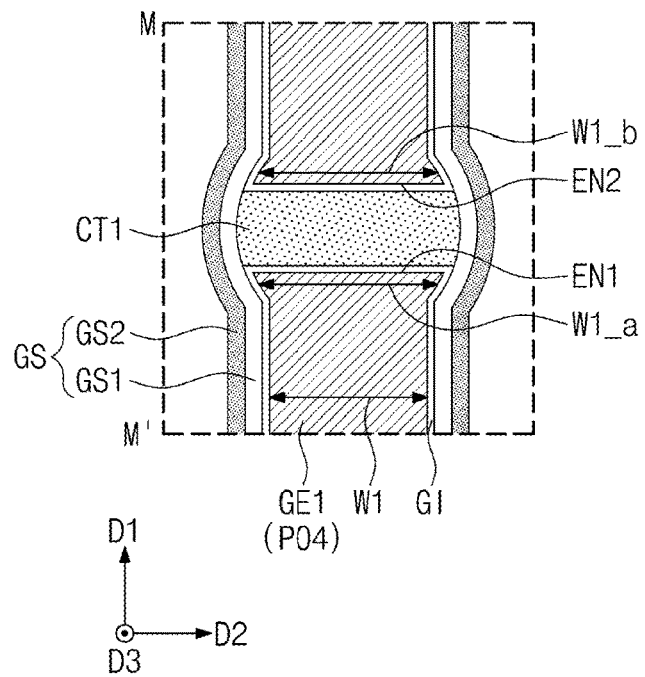
FIGS. 13 and 14 illustrate cross-sectional views taken along line M-M' of FIG. 5D, of a semiconductor device according to some embodiments.
Figure 14:
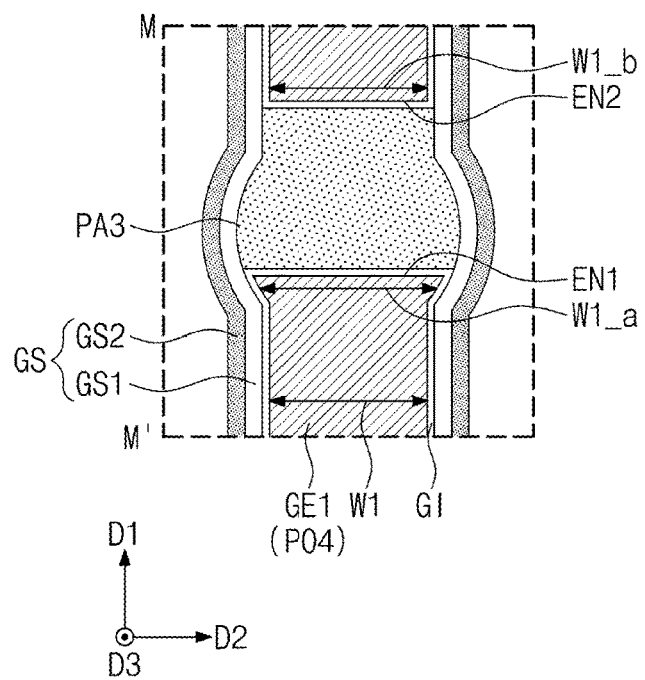

FIGS. 13 and 14 illustrate cross-sectional views taken along line M-M' of FIG. 5D, of a semiconductor device according to some embodiments. In the embodiment that follows, a repeated detailed description of technical features discussed above with reference to FIG. 6A may be omitted, and a difference thereof will be discussed in detail.

Referring to FIGS. 4 and 13, a width in the first direction D1 of the first cutting pattern CT1 may be less than a width in the first direction D1 of the first cutting pattern CT1 shown in FIG. 6A. The first end EN1 of the first gate electrode GE1 may have a width $W1\_a$ greater than the width W1 of the first gate electrode GE1. The second end EN2 of the first gate electrode GE1 may have a width $W1\_b$ greater than the width W1 of the first gate electrode GE1. In an implementation, the first gate electrode GE1 may have a profile such that its width increases along a direction toward the first cutting pattern CT1.

Referring to FIGS. 4 and 14, the first cutting pattern CT1 may have a shape offset in the first direction D1, compared to the first cutting pattern CT1 of FIG. 6A. In an implementation, the first end EN1 of the first gate electrode GE1 may have a width $W1\_a$ greater than the width W1 of the first gate electrode GE1. The second end EN2 of the first gate electrode GE1 may have a width $W1\_b$ the same as the width W1 of the first gate electrode GE1. The width $W1\_a$ of the first end EN1 may be greater than the width $W1\_b$ of the second end EN2.

FIGS. 15A, 15B, 15C, and 15D illustrate cross-sectional views respectively taken along lines A-A', B-B', C-C', and D-D' of FIG. 4, of a semiconductor device according to some embodiments. In the embodiment that follows, a repeated detailed description of technical features discussed above with reference to FIGS. 4 and 5A to 5D may be omitted, and a difference thereof will be discussed in detail.

Referring to FIGS. 4 and 15A to 15D, the device isolation layer ST may define a first active pattern AP1 and a second active pattern AP2 on an upper portion of the substrate 100. The first active pattern AP1 may be defined on the PMOSFET region PR1 or PR2, and the second active pattern AP2 may be defined on the NMOSFET region NR1 or NR2.

The device isolation layer ST may cover a lower sidewall of each of the first and second active patterns AP1 and AP2. An upper portion of each of the first and second active patterns AP1 and AP2 may protrude upwardly from the device isolation layer (see FIG. 15D).

The first active pattern AP1 may include, on its upper portion, first source/drain patterns SD1 and a first channel pattern CH1 between the first source/drain patterns SD1. The second active pattern AP2 may include, on its upper portion, second source/drain patterns SD2 and a second channel pattern CH2 between the second source/drain patterns SD2.

Referring back to FIG. 15D, each of the first and second channel patterns CH1 and CH2 may not include any of the first, second, and third semiconductor patterns SP1, SP2, and SP3 discussed above with reference to FIGS. 5A to 5D. Each of the first and second channel patterns CH1 and CH2 may have a semiconductor pillar shape that protrudes upwardly from the device isolation layer ST.

The first gate electrode GE1 may cover a top surface and opposite sidewalls of each of the first and second channel patterns CH1 and CH2. In this sense, a transistor according to the present embodiment may be a three-dimensional field effect transistor (e.g., FinFET) in which the first gate electrode GE1 three-dimensionally surrounds the first and second channel patterns CH1 and CH2.

A first interlayer dielectric layer 110 and a second interlayer dielectric layer 120 may be on an entire surface of the substrate 100. Active contacts AC may penetrate the first and second interlayer dielectric layers 110 and 120 and may correspondingly connect with the first and second source/drain patterns SD1 and SD2. A gate contact GC may penetrate the second interlayer dielectric layer 120 and the gate capping pattern GP and may connect with the first gate electrode GE1. A detailed description of the active contacts AC and the gate contacts GC may be substantially the same as that discussed above with reference to FIGS. 4 and 5A to 5D.

A third interlayer dielectric layer 130 may be on the second interlayer dielectric layer 120. A fourth interlayer dielectric layer 140 may be on the third interlayer dielectric layer 130. A first metal layer M1 may be in the third interlayer dielectric layer 130. A second metal layer M2 may be in the fourth interlayer dielectric layer 140. A detailed description of the first metal layer M1 and the second metal layer M2 may be substantially the same as that discussed above with reference to FIGS. 4 and 5A to 5D.

Figure 15A:
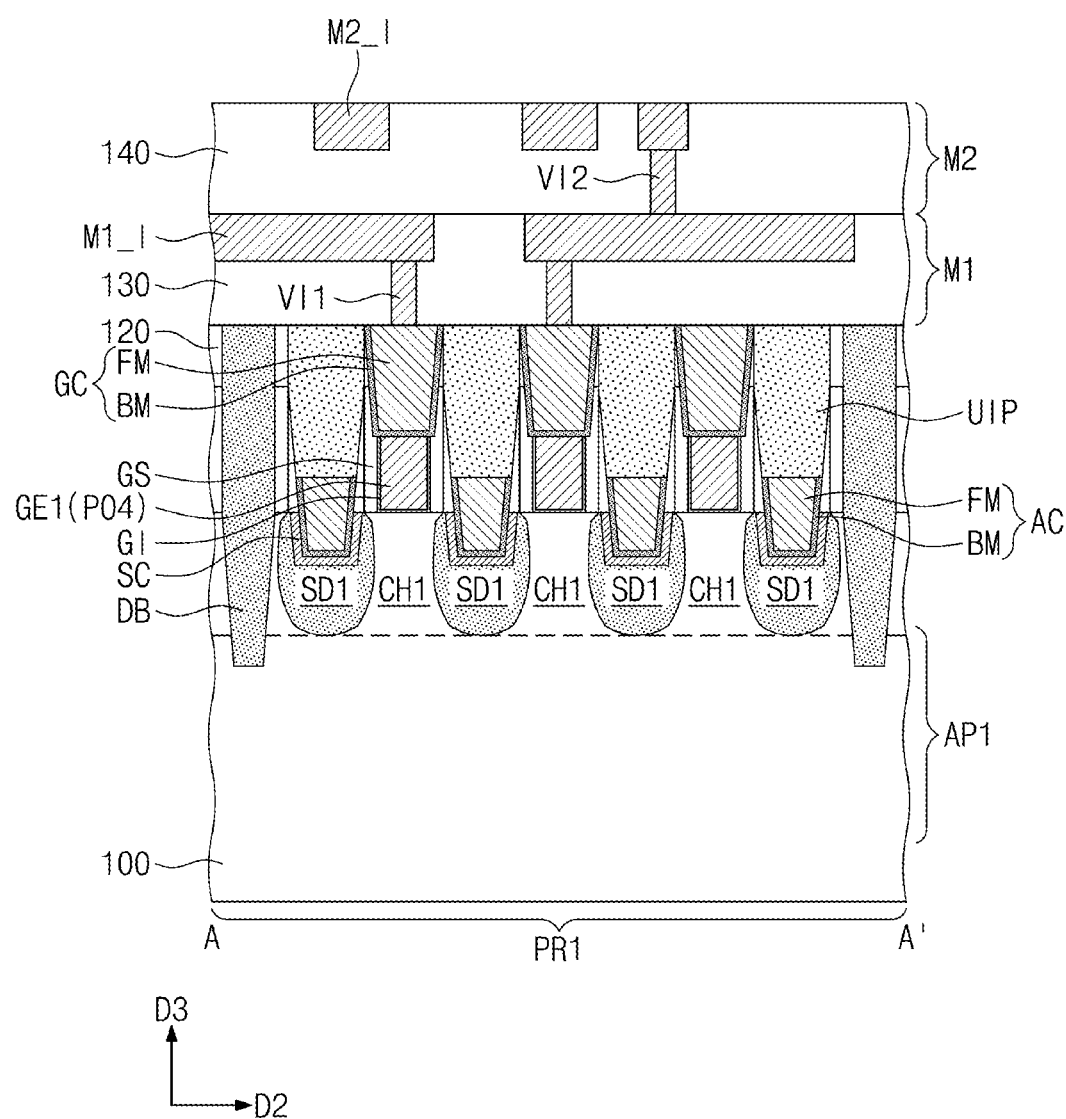
FIGS. 15A, 15B, 15C, and 15D illustrate cross-sectional views respectively taken along lines A-A', B-B', C-C', and D-D' of FIG. 4, of a semiconductor device according to some embodiments.
Figure 15B:
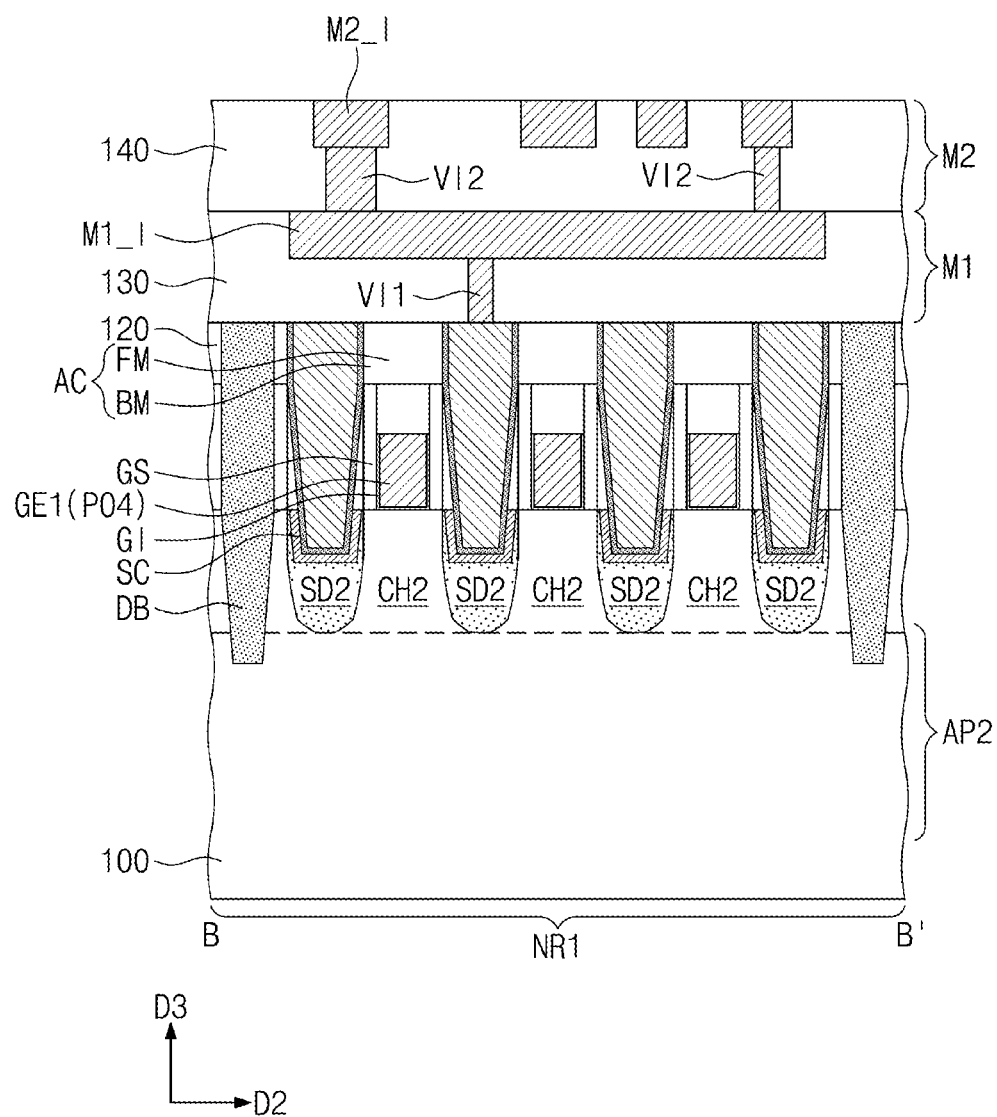
Figure 15C:
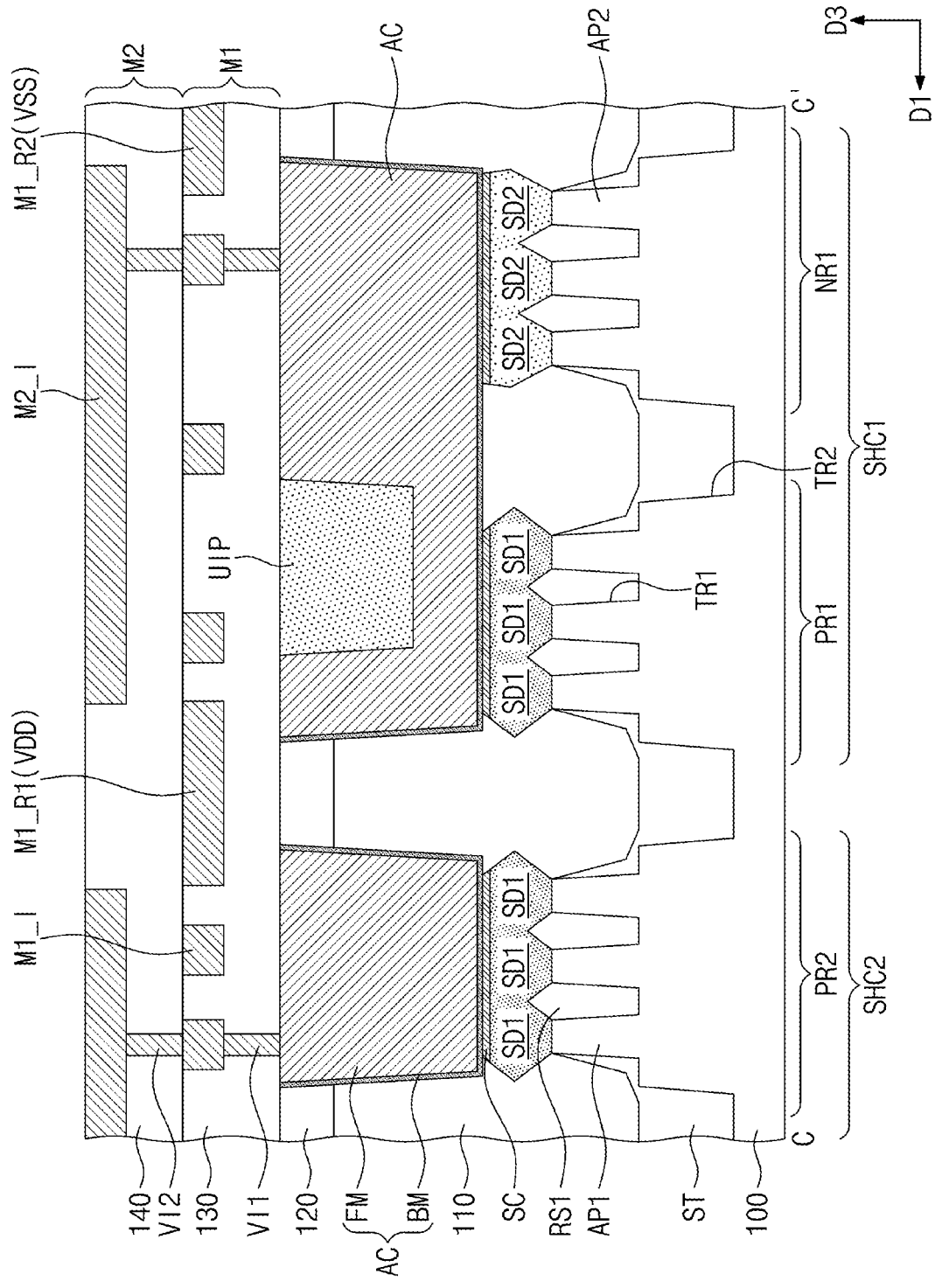
Figure 15D:
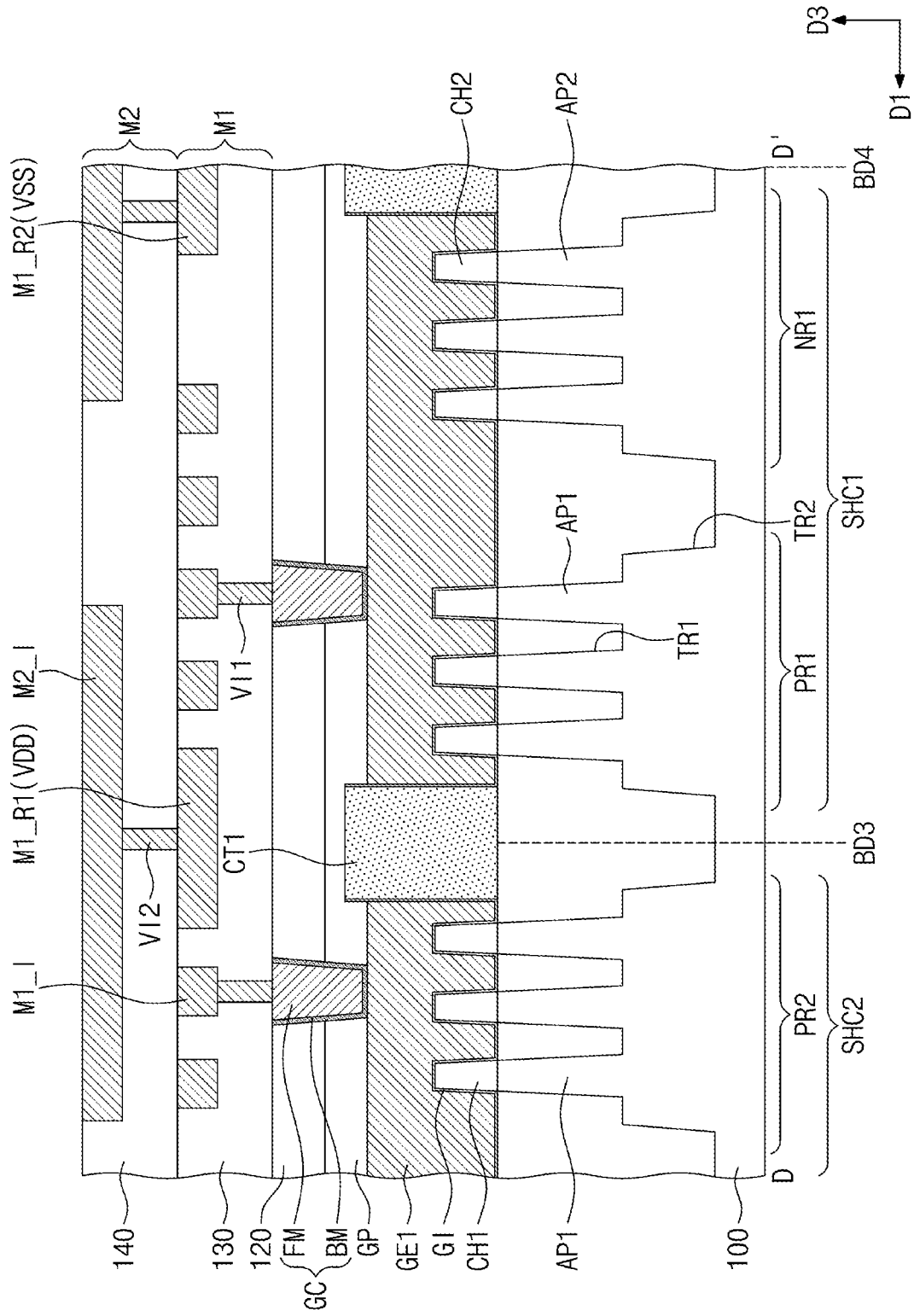

A plan view of the first cutting pattern CT1 shown in FIG. 15D may be substantially the same as that of FIG. 6A. In an implementation, the first cutting pattern CT1 may have a width greater than that of the first gate electrode GE1. As a result, a semiconductor device may exhibit an increased reliability.

By way of summation and review, a scale down of MOSFETs could deteriorate operating characteristics of the semiconductor device. Methods of fabricating semiconductor devices having superior performances while overcoming limitations caused by high integration of the semiconductor devices have been considered.

For a semiconductor device according to an embodiment, a first cutting pattern of a single gate (SG) device may have a relatively large width, and thus it may be possible to help prevent process failure caused by electrical short between gate electrodes of the SG device. In addition, a second cutting pattern of an extra gate (EG) device may have a relatively small width, and thus it may be possible to prevent process failure caused by electrical short between gate electrodes of the EG device. As a result, a semiconductor device may exhibit an increased reliability.

One or more embodiments may provide a semiconductor device including a field effect transistor.

One or more embodiments may provide a semiconductor device with increased reliability and improved electrical properties.

One or more embodiments may provide a method of fabricating a semiconductor device with increased reliability and improved electrical properties.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it will be understood by those of skill in the art that various changes in form and details may be made without departing from the spirit and scope of the present invention as set forth in the following claims.

What is claimed is:

1. A semiconductor device, comprising:
    a substrate that includes a first region and a second region;
    a first active pattern on the first region and a second active pattern on the second region;
    a first gate electrode on the first active pattern and a second gate electrode on the second active pattern; and
    a first cutting pattern that penetrates the first gate electrode and a second cutting pattern that penetrates the second gate electrode,
    wherein:
    a width of the first gate electrode as measured in a first one direction is less than a width of the second gate electrode as measured in the first one direction,
    a maximum width of the first cutting pattern as measured in the first one direction is greater than the width of the first gate electrode as measured in the first one direction, and
    a minimum width of the second cutting pattern as measured in the first one direction is less than the width of the second gate electrode as measured in the first one direction.

2. The semiconductor device as claimed in claim 1, wherein, when viewed in plan,
    a sidewall of the first cutting pattern has a convex profile, and
    a sidewall of the second cutting pattern has a concave profile.

3. The semiconductor device as claimed in claim 2, further comprising:
    a first gate spacer on a sidewall of the first gate electrode; and
    a second gate spacer on a sidewall of the second gate electrode,
    wherein:
    the first gate spacer convexly bends along the sidewall of the first cutting pattern, and
    the second gate spacer concavely bends along the sidewall of the second cutting pattern.

4. The semiconductor device as claimed in claim 1, wherein:
    the first cutting pattern is between a first end of the first gate electrode and a second end of the first gate electrode, and
    the width of the first cutting pattern as measured in the first direction increases to the maximum width of the first cutting pattern and then decreases along a second direction from the first end of the first gate electrode toward the second end of the first gate electrode.

5. The semiconductor device as claimed in claim 4, wherein a width of the first end of the first gate electrode as measured in the first direction is greater than a width of the second end of the first gate electrode as measured in the first direction.

6. The semiconductor device as claimed in claim 4, wherein a width of at least one of the first end of the first gate electrode and the second end of the first gate electrode, as measured in the first direction, is greater than a width of other parts of the first gate electrode as measured in the first direction.

7. The semiconductor device as claimed in claim 1, wherein:
    the second cutting pattern is between a first end of the second gate electrode and a second end of the second gate electrode, and
    the width of the second cutting pattern as measured in the first direction decreases to the minimum width of the second cutting pattern and then increases along a second direction from the first end of the second gate electrode toward the second end of the second gate electrode.

8. The semiconductor device as claimed in claim 1, wherein:
    the first region is an area including a single gate device, and
    the second region is an area including an extra gate device.

9. The semiconductor device as claimed in claim 1, further comprising:
    a pair of first source/drain patterns on the first active pattern and a first channel pattern between each first source/drain pattern of the pair of first source/drain patterns; and
    a pair of second source/drain patterns on the second active pattern and a second channel pattern between each second source/drain pattern of the pair of second source/drain patterns,
    wherein:
    the first channel pattern includes a plurality of first semiconductor patterns that are stacked on the first active pattern, and
    the second channel pattern includes a plurality of second semiconductor patterns that are stacked on the second active pattern.

10. The semiconductor device as claimed in claim 9, wherein:
the first gate electrode further includes a first part between each first semiconductor pattern of the plurality of first semiconductor patterns that are vertically adjacent to each other, and
the second gate electrode further includes a second part between each second semiconductor pattern of the plurality of second semiconductor patterns that are vertically adjacent to each other.

11. A semiconductor device, comprising:
a substrate that includes a first active region and a second active region;
a first active pattern on the first active region and a second active pattern on the second active region;
a pair of first source/drain patterns on the first active pattern and a first channel pattern between each first source/drain pattern of the pair of first source/drain patterns, the first channel pattern including a plurality of first semiconductor patterns that are stacked on the first active pattern;
a pair of second source/drain patterns on the second active pattern and a second channel pattern between each second source/drain pattern of the pair of second source/drain patterns, the second channel pattern including a plurality of second semiconductor patterns that are stacked on the second active pattern;
a gate electrode on each of the first and second channel patterns; and
a cutting pattern that penetrates the gate electrode, wherein:
the cutting pattern separates the gate electrode into a first gate electrode on the first channel pattern and a second gate electrode on the second channel pattern, the cutting pattern includes:
a first part adjacent to the first gate electrode;
a second part adjacent to the second gate electrode; and
a third part between the first part and the second part,
the first part has a first width as measured in a first direction,
the second part has a second width as measured in the first direction,
the third part has a third width as measured in the first direction,
the third width is greater than the first width, and
the third width is greater than the second width, and
wherein the semiconductor device further comprises a gate spacer that covers a sidewall of the cutting pattern and bends along the sidewall of the cutting pattern.

12. The semiconductor device as claimed in claim 11, wherein, when viewed in a plan view, a sidewall of the cutting pattern has a convex profile.

13. The semiconductor device as claimed in claim 12, wherein the gate spacer that covers the sidewall of the cutting pattern extends along a sidewall of the first gate electrode toward and along a sidewall of the second gate electrode,
wherein the gate spacer convexly bends along the sidewall of the cutting pattern.

14. The semiconductor device as claimed in claim 11, wherein the first gate electrode includes a climbing portion that obliquely extends from a top surface of the first gate electrode toward a top surface of the cutting pattern.

15. The semiconductor device as claimed in claim 11, wherein the first active region and the second active region are in an area including a single gate device.

16. A semiconductor device, comprising:
a substrate including a core/peripheral region;
an active pattern on the core/peripheral region of the substrate;
a pair of source/drain patterns on the active pattern and a channel pattern between each source/drain pattern of the pair of source/drain patterns, the channel pattern including a plurality of semiconductor patterns that are spaced apart from each other and are sequentially stacked on the active pattern;
a gate electrode on the plurality of semiconductor patterns;
a gate dielectric layer between the gate electrode and the plurality of semiconductor patterns, the gate dielectric layer surrounding each of the plurality of semiconductor patterns;
a cutting pattern that penetrates the gate electrode;
a gate spacer on a sidewall of the gate electrode and a sidewall of the cutting pattern;
an active contact electrically connected to at least one of the pair of source/drain patterns;
a gate contact electrically connected to the gate electrode;
a first metal layer on the active contact and the gate contact, the first metal layer including a plurality of first wiring lines that are electrically connected to the active contact and the gate contact; and
a second metal layer on the first metal layer,
wherein a minimum width of the cutting pattern as measured in a first direction is less than a width of the gate electrode as measured in the first direction.

17. The semiconductor device as claimed in claim 16, wherein:
the cutting pattern separates the gate electrode into a first gate electrode and a second gate electrode,
the cutting pattern includes:
a first part adjacent to the first gate electrode;
a second part adjacent to the second gate electrode; and
a third part between the first part and the second part,
the first part has a first width as measured in the first one direction,
the second part has a second width as measured in the first one direction,
the third part has a third width as measured in the first one direction,
the third width is less than the first width, and
the third width is less than the second width.

18. The semiconductor device as claimed in claim 16, wherein, when viewed in plan, the sidewall of the cutting pattern has a concave profile.

19. The semiconductor device as claimed in claim 18, wherein the gate spacer concavely bends along the sidewall of the cutting pattern.

20. The semiconductor device as claimed in claim 16, wherein the core/peripheral region is an area including an extra gate device.

* * * * *